United States Patent

Shimizu et al.

[11] Patent Number: 5,922,411
[45] Date of Patent: Jul. 13, 1999

[54] COMPOSITION FOR FORMING CERAMIC MATERIAL AND PROCESS FOR PRODUCING CERAMIC MATERIAL

[75] Inventors: Yasuo Shimizu; Hideki Matsuo; Kazuhiro Yamada, all of Saitama-ken, Japan

[73] Assignee: Tonen Corporation, Japan

[21] Appl. No.: 08/793,943

[22] PCT Filed: Jul. 15, 1996

[86] PCT No.: PCT/JP96/01976

§ 371 Date: Mar. 7, 1997

§ 102(e) Date: Mar. 7, 1997

[87] PCT Pub. No.: WO97/03131

PCT Pub. Date: Jan. 30, 1997

[30] Foreign Application Priority Data

Jul. 13, 1995 [JP] Japan ................... 7-200584
Dec. 5, 1995 [JP] Japan ................... 7-344767
Dec. 27, 1995 [JP] Japan ................... 7-341601

[51] Int. Cl.$^6$ ........................... B05D 3/02
[52] U.S. Cl. .................. 427/397.7; 427/376.2; 427/377; 501/53; 501/133; 428/688
[58] Field of Search ................. 427/376.2, 377, 427/397.7; 501/53, 133; 428/688

[56] References Cited

U.S. PATENT DOCUMENTS 5,190,709  3/1993  Lukacs, III ................. 264/63
5,318,857  6/1994  Haluska ................... 428/552
5,616,650  4/1997  Becker et al. ............. 525/102
5,747,623  5/1998  Matsuo et al. ............. 528/14

FOREIGN PATENT DOCUMENTS 384034   4/1991  Japan ............... C08G 77/62
6-128529  5/1994  Japan ............... C09D 183/16
6128529   5/1994  Japan ............... C09D 183/16
7-223867  8/1995  Japan ............... C04B 35/589
8176511   7/1996  Japan ............... C09D 183/16

*Primary Examiner*—Felisa Hiteshew
*Attorney, Agent, or Firm*—Lorusso & Loud

[57] ABSTRACT

Disclosed are a composition for forming a ceramic material useful for smoothly forming a ceramic film at a low temperature on surfaces of solid products such as substrates used in electronic products, plastic films or the like and a process for producing such a ceramic material. The aforementioned composition comprises a silazane-based polymer, and at least one ceramic-transformation promoting agent selected from the group consisting of an amine compound, an acid compound and peroxide. Further, the afore-mentioned ceramic material can be produced by bringing a mixture of the silazane-based polymer and the ceramic-transformation promoting agent into contact with steam.

9 Claims, No Drawings

COMPOSITION FOR FORMING CERAMIC MATERIAL AND PROCESS FOR PRODUCING CERAMIC MATERIAL

TECHNICAL FIELD

The present invention relates to a composition for forming a ceramic material, such a ceramic material, a process for producing the ceramic material, a process for producing a ceramic film on a surface of a solid body, and a process for producing a solid product having the ceramic film on the solid body.

BACKGROUND ART

Silazane-based polymers such as polysilazanes or polymetallo-silazanes are specific polymers capable of being transformed into a ceramic material. When such polymers are transformed into a ceramic material, there can be obtained ceramic materials which are excellent in heat resistance, abrasion resistance, corrosion resistance or the like and composed substantially of $SiO_2$.

As is known, the silazane-based polymers have been widely utilized as a film-forming component for coating materials (Japanese Patent Application Laid-open Nos. 99327/1987 and 203476). In order to form a ceramic film on a substrate using the coating material containing the silazane-based polymer, there has been adopted a method which comprises applying the coating material onto the substrate to form a polymer film thereon and thereafter transforming the polymer film into a ceramic material.

However, such a conventional method for the ceramic-transformation of the silazane-based polymers, the polymer has to be calcined at a high temperature on the order of 900° C. For this reason, there has arose such a problem that the resultant ceramic film tends to suffer from deficiencies such as voids, pinholes, cracks or the like.

In addition, in order to carry out the ceramic-transformation of the polysilazane-based polymer at a reduced temperature, there have been proposed a method in which the polymer film is calcined in an oxidation atmosphere (WO93/02472), and a method in which a mixture of polysilazane and polysiloxane is used (Japanese Patent Application Laid-open No. 73340/1994).

In these conventional methods, it is possible to transform the silazane-based polymer into a ceramic material at a temperature as low as 450° C. and therefore produce a ceramic film having a good denseness and an excellent resistance to cracking. However, the temperature used in these conventional methods is still too high so as not to be applied to ceramic forming techniques in the fields of electronic products such as semiconductor devices or liquid crystal devices, plastic products or the like. Accordingly, the conventional methods cannot be utilized as ceramic forming techniques in these fields.

Further, in the afore-mentioned conventional methods for transforming the silazane-based polymer into a ceramic material, low molecular weight polymers are scattered around due to a high temperature required to calcine the polymer, so that there arises inconveniences such as loss of the polymer, contamination of calcining apparatuses used, or the like.

DISCLOSURE OF THE INVENTION

It is an object of the present invention to provide a silazane-based polymer composition capable of being smoothly transformed into a ceramic material at a reduced temperature.

It is another object of the present invention to provide a process for smoothly producing a ceramic material at a reduced temperature using a silazane-based polymer composition.

It is a further object of the present invention to provide a process for smoothly producing a ceramic film on a surface of a solid body at a reduced temperature using a silazane-based polymer composition.

It is a still further object of the present invention to provide a process for smoothly producing a ceramic film on a surface of a substrate used in the field of electronic products at a reduced temperature using a silazane-based polymer composition.

It is a still further object of the present invention to provide a process for smoothly producing a ceramic film on a surface of a plastic body at a reduced temperature using a silazane-based polymer composition.

It is a still further object of the present invention to provide a process for smoothly producing a ceramic film on a surface of an elongated plastic film at a reduced temperature using a silzane-based polymer composition.

It is a still further object of the present invention to provide to solid product having a ceramic film produced by any one of the afore-mentioned processes, on a surface of a solid body.

Further and other objects of the present invention will become apparent by referring to the following detailed description.

As a result of various studies made by the present inventors to transform a silazane-based polymer into a ceramic material at a reduced temperature, it has been found that the silazane-based polymer is smoothly transformed into a ceramic material even at a temperature as low as not more than 50° C. by bringing the silazane-based polymer, to which at least one compound selected from the group consisting of an amine compound, an acid compound and a peroxide is added as a ceramic-transformation promoting agent, into contact with steam. In addition, the present inventors have found that the silazane-based polymer is smoothly transformed into a ceramic material by bringing the silazane-based polymer into contact with a vapor of the afore-mentioned compound and steam, separately or simultaneously.

The present invention has been attained on the basis of this finding.

In one aspect of the present invention, there is provided a composition for forming a ceramic material, which comprises a mixture of a silazane-based polymer and at least one ceramic-transformation promoting agent selected from the group consisting of an amine compound, an acid compound and a peroxide.

In another aspect of the present invention, there is provided a process for producing a ceramic material, which comprises the step of bringing a mixture of the silazane-based polymer and the ceramic-transformation promoting agent into contact with steam to transform the polymer into the ceramic material.

In a further aspect of the present invention, there is provided a process for producing a ceramic material, which comprises the step of bringing the silazane-based polymer into contact with an aqueous solution containing the afore-mentioned ceramic-transformation promoting agent to transform the polymer into the ceramic material.

In a still further aspect of the present invention, there is provided a process for producing a ceramic material, which comprises the step of bringing the silazane-based polymer into contact with a vapor of the afore-mentioned ceramic-transformation promoting agent, separately or simultaneously, to transform the polymer into the ceramic material.

In a still further aspect of the present invention, there is provided a ceramic material produced by any one of the afore-mentioned processes.

In a still further aspect of the present invention, there is provided a process for producing a ceramic film on a surface of a solid body, which comprises the steps of forming, on the surface of the solid body, which comprises the steps of forming, on the surface of the solid body, a film comprising the silazane-based polymer and the ceramic-transformation promoting agent, and bringing the film into contact with steam to transform the film into the ceramic film.

In a still further aspect of the present invention, there is provided a process for producing a ceramic film on a surface of a solid body, which comprises the steps, of forming, on the surface of the solid body, a film comprising a silazane-based polymer, and bringing the film into contact with an aqueous solution containing the afore-mentioned ceramic-transformation promoting agent to transform the film into the ceramic film.

In a still further aspect of the present invention, there is provided a process for producing a ceramic film on a surface of a solid body, which comprises the steps of forming, on the surface of the solid body, a film comprising the silazane-based polymer, and bringing the film into contact with a vapor of the afore-mentioned ceramic-transformation promoting agent and steam, separately or simultaneously, to transform the film into the ceramic film.

In a still further aspect of the present invention, there is provided a solid product having the ceramic film produced according to any of the afore-mentioned ceramic film-forming processes, on the surface of the solid body.

The silazane-based polymers used in the present invention are various known polymers having, in main chains thereof, structural units of the following general formula (I):

$$—[Si(R^1)(R^2)—N(R^3)]— \qquad (I)$$

wherein $R^1$, $R^2$ and $R^3$ are hydrogen or an organic group with the proviso that at least one of $R^1$, $R^2$ and $R^3$ is hydrogen.

The organic groups may include not only those organic groups having carbon atoms directly bonded to the silicon atom (Si) or the nitrogen atom (N) but also those organic groups having hetero-atoms directly bonded to the silicon atom (Si) or the nitrogen atom (N). Examples of the hetero-atoms are a silicon atom, a nitrogen atom, an oxygen atom, a sulfur atom or the like.

Specific examples of the suitable organic groups include hydrocarbon groups such as an alkyl group, an alkenyl group, a cycloalkyl group, an aryl group or an aralkyl group; silyl groups having hydrocarbon groups, such as an alkylsilyl group or an arylsilyl group; amino groups having hydrocarbon groups, such as an alkylamino group or an arylamino group; hydrocarbon-oxy groups such as an alkoxy group, an aryloxy group or an aralkyloxy group, or the like. These hydrocarbon groups have 1 to 18 carbon atoms, preferably 1 to 12 carbon atoms, more preferably 1 to 8 carbon atoms. Further, the hydrocarbon groups may have substituent groups. Examples of the suitable substituent groups include a halogen atom, an alkoxy group, an amino group, a carboxyl group, a hydroxyl group, an alkoxycarbonyl group, a nitro group or the like.

In the present invention, as the silazane-based polymers, there can be used not only ordinary polysilazanes but also various modified polysilazanes such as poly-metallo-silazanes or silazane copolymers. Further, the silazane-based polymers may be those having a chain structure, a cyclic structure or both the structures. Furthermore, the silazane-based polymers may have a cross-linked structure in a molecule thereof.

The silazane-based polymers used in the present invention have a number-average molecular weight of 100 to 50,000, preferably 200 to 10,000.

The silazane-based polymers of the present invention can be used singly or in the form of a mixture of any two or more thereof. Further, the silazane-based polymers of the present invention can be used in the form of a mixture of the silazane-based polymer and other kinds of polymers.

Next, typical examples of the silazane-based polymers used in the present invention are described below though not limited thereto.

In the silazane-based polymers having the structural units of the general formula (I) (hereinafter occasionally referred to merely as "polymers"), silazane-based polymers in which all of $R^1$, $R^2$ and $R^3$ in the formula (I) are hydrogen, are perhydropolysilazane whose production methods have been reported, for example, in Japanese Patent Application Laid-open No. 145903/1985 and D. Seyferth et al., "Communication of Am. Cer. Soc.", C-13, January 1983. The products produced by these methods are in the form of a mixture of various polymers having different structures. However, essential components of the products are those having a chain portion and a cyclic portion in a molecule thereof and can be represented by the following chemical formula:

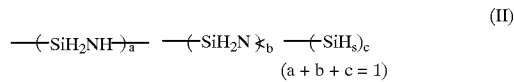

(II)

$$(a + b + c = 1)$$

An example of such structures of the perhydropolysilazane is as follows:

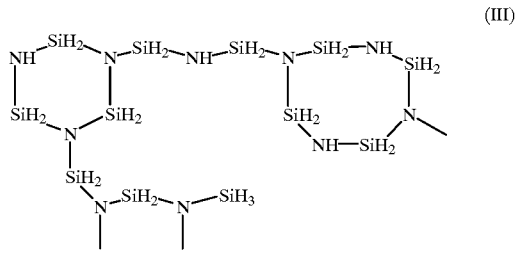

(III)

In the polymers having the structural unit of the general formula (I), those having a structure in which $R^1$ and $R^2$ are hydrogen and $R^3$ is methyl, have been reported in D. Seyferth et al., "Polym. Prepr. Am. Chem. Soc., div. Polym. Chem.", 25, 10(1984) The polysilazane produced by the method are polymers having a chain or cyclic structure with a repeating unit of —(SiH$_2$NCH$_3$)— but any of those polymers have no cross-linked structure.

In the polymers having the structural unit of the general formula (I), those having a structure in which $R^1$ $^{and\ R2}$ are hydrogen and $R^3$ is an organic group, have been reported in D. Seyferth et al., "Polym. Prepr. Am. Chem. Soc., div. Polym. Chem.", 25, 10(1984) and Japanese Patent Application No. 89230/1986. The polysilazanes produced by these method include polymers which contain a repeating unit of —(R²SiHNH)— and are primarily of a cyclic structure having a degree of polymerization of 3 to 5, or polymers having both the chain and cyclic structures in molecules thereof represented by the chemical formula of $(R^3SiHNH)_x[(R^2SiH)]_{1.5}N]_{1-x}$ (0.4<X<1).

In the polymers having the structural unit of the general formula (I), polysilazanes having a structure in which $R^1$ is hydrogen and $R^2$ and $R^3$ are an organic group, or in which $R^1$ and $R^2$ is an organic group and $R^3$ is hydrogen, may include polymers which contain a repeating unit of —(R¹R²SiNR³)— and are primarily of a cyclic structure having a degree of polymerization of 3 to 5.

Next, typical other kinds of polymers usable in the present invention are described below. In the polyorgano (hydro) silazanes, there exist polymers having a cross-linked structure in molecules thereof as reported in D. Seyferth et al., "Communication of Am. Cer. Soc.", C-132, July 1984. An example of such polymers is as follows:

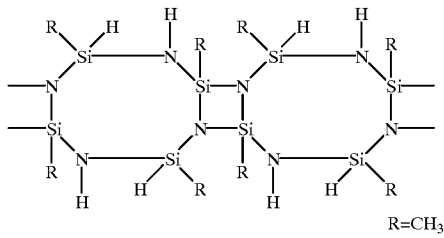

(IV)

R=CH₃

Also, in the present invention, there can be used polysilazanes of $R^1Si(NH)_x$ having a cross-linked structure obtained by the ammonolysis of $R^1SiX_3$ where X is halogen, or polysilazanes having a structure of the following formula (V) obtained by the co-ammonolysis of $R^1SiX_3$ and $R^2{}_2SiX_2$:

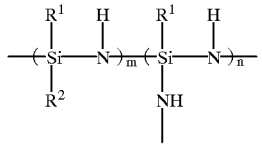

(V)

wherein m and n are positive integer and M is a metal atom.

The polymers used in the present invention have a main skeleton composed of structural units each represented by the afore-mentioned general formula (I). As described above, the structural unit may be cyclized. In this case, the cyclized unit constitutes a terminal group. On the other hand, if polymers have no cyclized structural unit, the main skeleton of the polymer has terminal groups identical to $R^1$, $R^2$ or $R^3$, or hydrogen.

In addition, in accordance with the present invention, as the modified polysilazanes, there can be used, for example, metal-containing poly-metallo-silazane having the following formula:

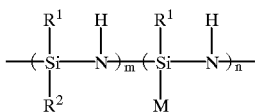

(VI)

wherein m and n are positive integers and M is a metal atom.

In the above-mentioned general formula, the metal atom M constituting one of side chains may be cross-linked.

Besides, in accordance with the present invention, there can be used polysilazanes having repeating units represented by the formulae of $[(SiH_2)_n(NH)_m]$ and $[(SiH_2)_rO]$ (wherein n, m and r are independently 1, 2 or 3) as disclosed in Japanese Patent Application Laid-open No. 195024/1987; polysilazanes produced by reacting polysilazane with a boron compound and having an excellent heat resistance as disclosed in Japanese Patent Application Laid-open No. 84437/1990; polysilazanes produced by reacting polysilazane with metal alkoxide as disclosed in Japanese Patent Application Laid-open Nos. 81122/1988, 191832/1988 and 77427/1990; inorganic silazane high polymers or modified polysilazanes as disclosed in Japanese Patent Application Laid-open Nos. 138108/1989, 138107/1989, 203429/1989, 203430/1989, 63833/1992 and 320167/1991; silazane copolymers produced by introducing an organic component into polysilazane and suitable for producing a film having an increased thickness as disclosed in Japanese Patent Application Laid-open Nos. 331293/1993 and 31326/1991; polysilazanes in which a catalytic compound for promoting a ceramic-transformation is added or mixed and which can be suitably applied to metal such as aluminum and transformed into the ceramic material at a lower temperature as disclosed in Japanese Patent Application Laid-open Nos. 238827/1993, 122852/1994, 299118/1994, 240208/1994 and 196986/1995; or the like.

Also, in the present invention, there can be used modified polysilazane as disclosed in Japanese Patent Application Laid-open No. 238827/1993. The modified polysilazane is silicon alkoxide-added polysilazane produced by heat-reacting the polysilazane having structural units represented by the afore-mentioned general formula (1) with silicon alkoxide of the general formula (VII):

$$Si(OR^4)_4 \quad \text{(VII)}$$

wherein $R^4$'s may be the same or different and are hydrogen or an alkyl or aralkyl group having 1 to 20 carbon atoms with the proviso that at least one of the $R^4$'s is the afore-mentioned alkyl or aralkyl group. The silicon alkoxide-added polysilazane has a atomic ratio of the silicon derived from alkoxide to the silicon derived from polysilazane of 0.001 to 3 and a number-average molecular weight of about 200 to about 500,000.

Further, in the present invention, there can be used modified polysilazanes as disclosed in Japanese Patent Application Laid-open No. 122852/1994. The modified polysilazane is glycidol-added polysilazane which is produced by reacting the polysilazane having the afore-mentioned general formula (I) with glycidol and has a weight ratio of glycidol to polysilazane of 0.001 to 2 and a number-average molecular weight of about 200 to about 500,000.

Further, in the present invention, there can be used acetyl acetonate complex-added polysilazanes.

The modified polysilazane is acetyl acetonate complex-added polysilazane which is produced by reacting the polysilazane having repeating units of the afore-mentioned general formula (I) with an acetyl acetonate complex containing metal such as nickel, platinum, palladium or aluminum, and has a weight ratio of the acetyl acetonate complex to the polysilazane of 0.000001 to 2 and a number-average molecular weight of about 200 to about 500,000. The afore-mentioned metal-containing acetyl acetonate complex is such a complex produced by coordinating an anion (acac⁻) generated by acid dissociation from acetyl acetone (2,4-pentadione) onto a metal atom, and represented by the general formula of $(CH_3COCHCOCH_3)_nM$ where M is n-valent metal.

Furthermore, in the present invention, there can be used metal carboxylate-added polysilazane as disclosed in Japanese Patent Application Laid-open No. 299118/1994.

The modified polysilazane is metal carboxylate-added polysilazane which can be produced by reacting the polysilazane having repeating units represented by the afore-mentioned general formula (I) with a metal carboxylate containing at least one metal selected from the group consisting of nickel, titanium, platinum, rhodium, cobalt, iron, ruthenium, osmium, palladium, iridium and aluminum, and has a weight ratio of the metal carboxylate to polysilazane of 0.000001 to 2 and a number-average molecular weight of about 200 to about 500,000. The afore-mentioned metal carboxylate is a polymer represented by the general formula of $(RCOO)_nM$ where R is an aliphatic or alicyclic group having 1 to 22 carbon atoms, M is at least one metal selected from the afore-mentioned metals and n is a valence of the metal M. The metal carboxylate may be an anhydride or a hydrate. The weight ratio of the metal carboxylate to the polysilazane is preferably in the range of 0.001 to 1, more preferably 0.01 to 0.5. With respect to the process for the production of the metal carboxylate-added polysilazane, reference should be made to the afore-mentioned Japanese Patent Application Laid-open No. 299118/1994.

Typical examples of polysilazane-based polymers used in the present invention are described hereinbefore but the present invention is not intended to be limited thereto. Among these polysilazane-based polymers, perhydrosilazane-based polymers are preferably from the standpoint of the hardness and the denseness of a ceramic material produced from the polymers. On the other hand, from the standpoint of the flexibility of the ceramic material produced from the polymers, organosilazane-based polymers are preferably used. In the present invention, appropriate silazane-based polymers can be selectively used depending upon the aimed properties of the ceramic material produced.

The composition for producing a ceramic material according to the present invention may be in the form of a mixture comprising the afore-mentioned polysilazane or modified polysilazane and at least one ceramic-transformation promoting agent (hereinafter occasionally referred to merely as "CPA") selected from the group consisting of an amine compound, an acid compound and a peroxide.

The amine compounds may be chain or cyclic compounds. The chain compounds may include, for example, those represented by the following general formula (VII):

$R^5R^6R^7N$ (VII)

where $R^5$, $R^6$ and $R^7$ are independently hydrogen or an organic group with the proviso that at least one of $R^5$, $R^6$ and $R^7$ is the organic group. The organic groups may be not only organic groups having a carbon atom directly bonded to the nitrogen atom (N), but also those having a hetero-atom directly bonded to the nitrogen atom (N). Examples of the hetero-atoms may include a silicon atom, a nitrogen atom, an oxygen atom, a sulfur atom or the like.

Specific examples of the organic groups may include hydrocarbon groups such as an alkyl group, an alkenyl group, an aryl group or an aralkyl group; silyl groups having a hydrocarbon group, such as an alkylsilyl group or an arylsilyl group; amino groups having a hydrocarbon group, such as an alkylamino group or an arylamino group; hydrocarbon-oxy groups such as alkoxy group, an aryloxy group or an aralkyloxy group; or the like.

The afore-mentioned hydrocarbon groups may have substituent groups. Examples of the suitable substituent groups may include a halogen atom, an alkoxy group, an amino group, a carboxyl group, a hydroxyl group, an alkoxycarbonyl group, a nitro group or the like.

Specific examples of the amine compounds represented by the afore-mentioned general formula (VII) may include methyl amine, dimethyl amine, trimethyl amine, ethyl amine, diethyl amine, triethyl amine, propyl amine, dipropyl amine, tripropyl amine, butyl amine, dibutyl amine, tributyl amine, pentyl amine, dipentyl amine, tripentyl amine, hexyl amine, dihexyl amine, trihexyl amine, heptyl amine, diheptyl amine, octyl amine, dioctyl amine, trioctyl amine, phenyl amine, diphenyl amine, triphenyl amine or the like.

Example of the preferred chain amine compounds used in the present invention may include triethyl amine, tripentyl amine, tributyl amine, trihexyl amine, triheptyl amine and trioctyl amine.

Examples of the preferred cyclic amine compounds used in the present invention may include pyridine, α-picoline, β-picoline, γ-picoline, piperidine, rutizine, pyrimidine, pyridazine or the like, and further include DBU (1,8-diaza-bicyclo[5,4,0]7-undecene), DBN (1,5-diaza-bicyclo[4,3,0]5-nonene) or the like.

The acid compounds used in the present invention may be organic and inorganic acids. Examples of the organic acids may include carboxylic acids having a radical "—COOH", sulfonic acids having a radical "—SO₃H", or the like. Specific examples of these organic acids may include acetic acid, propionic acid, butylic acid, valeric acid, maleic acid, ethane-sulfonic acid or the like. Examples of the inorganic acids may include hydrochloric acid, nitric acid, phosphoric acid, chloric acid, hypochlorous acid, sulfuric acid or the like. Examples of the peroxides may include hydrogen peroxide, sodium peroxide, calcium peroxide, hydrogen peroxide adducts, peroxo acid, peroxo acid salts or the like. Examples of the hydrogen peroxide adducts include urea/hydrogen peroxide adduct [CO(NH₂)₂;H₂O₂], metasilicate/hydrogen peroxide adduct [Na₂SiO₃;H₂O₂] or the like. Examples of the peroxo acids or the salts thereof may include peroxo-disulfuric acid, peroxo-disulfuric acid salts, peroxo-carbonate, peroxo-borate or the like. In general, optional peroxides can be used as far as they can generate hydrogen peroxide when dissolved in water or an aqueous acid solution. Any of the afore-mentioned amine compounds, acid compounds and peroxides can be used singly or in the form of a mixture of any two or more thereof. In the present invention, especially, propionic acid, hydrochloric acid and hydrogen peroxide are preferably used.

The composition according to the present invention comprises a mixture of the silazane-based polymer and the afore-mentioned ceramic-transformation promoting agent (CPA). This composition may be in the form of powder or liquid. In the case of the powder composition, a polymer in the form of powder can be used as the silazane-based polymer. In this case, the CPA used may be in the form of solid or liquid. On the other hand, in the case of the liquid composition, solid or liquid polymer can be used as the silazane-based polymer. In this case, the CPA used may be in the form of gas, liquid or solid. In order to prepare the liquid composition, the polymer and the CPA are admixed with an organic solvent. As the organic solvents, any organic solvents capable of dissolving the polymer are usable.

Specific examples of the afore-mentioned organic solvents may include hydrocarbons such as aliphatic hydrocarbons, alicyclic hydrocarbons or aromatic hydrocarbons; halogenated hydrocarbons such as methane halide, ethane halide or halogenated benzene; ethers such as aliphatic ether or alicyclic ether ; carboxylic acid ester compounds; or the like. Specific examples of the preferred solvents may include liquefied methylene; halogenated hydrocarbons such as chloroform, carbon tetrachloride, bromoform, ethylene chloride, ethylidene chloride, trichloroethane or tetrachloroethane; ethers such as ethyl ether, iso-propyl ether, ethyl butyl ether, butyl ether, 1,2-dioxyethane, dioxane, dimethyl dioxane, tetrahydrofuran or tetrahydropyran; hydrocarbons such as pentane, hexane, iso-hexane, methyl pentane, heptane, iso-heptane, octane, iso-octane, cyclopentane, methyl cyclopentane, cyclohexane, methyl cyclohexane, benzene, toluene, xylene, ethyl benzene, ethyl cyclohexane, cyclohexene, p-menthane, limonene, decalin, tetralin, phenyl cyclohexane, nonane or decane; or silane compounds such as dimethyl-diethoxy-silane or methyl-triethoxy-silane. Examples of the carboxylic acid esters may include acetates such as methyl acetate, ethyl acetate, n-propyl acetate, i-propyl acetate, n-butyl acetate, i-butyl acetate, n-amyl acetate, i-amyl acetate, n-hexyl acetate, i-hexyl acetate, cyclohexyl acetate or phenyl acetate; propionates, butyrates or valerates having similar substituents; or the like. Further, as the carboxylic acid esters, there can be used divalent carboxylic acid esters such as dimethyl maleate, dimethyl oxalate, diethyl oxalate, dimethyl phthalate or diethyl phthalate. The afore-mentioned solvents can be used in the form of a mixture of any two or more thereof.

The liquid composition used in the present invention may be in the form of a solution or a slurry. The amount of the polymer contained in the liquid composition is usually in the range of 0.01 to 99% by weight, preferably 0.1 to 50% by weight though not particularly limited thereto.

In the case where the amine compound is used as the CPA, the amount of the CPA added is not less than 1 ppm by weight, preferably in the range of 10 ppm by weight to 100% by weight, more preferably in the range of 100 ppm by weight to 50% by weight, based on the weight of the polymer. Effects of transforming the polymer into a ceramic material by the amine compound tend to be increased as the strength exponent ($pK_B$ in an aqueous solution) of the amine compound becomes larger. Further, the effects tend to be increased as the boiling point of the amine compound becomes higher.

In the case where the acid compound or the peroxide is used as the CPA, the amount of these compounds added is not less than 0.1 ppm by weight, preferably in the range of 10 ppm by weight to 10% by weight, more preferably in the range of 10 ppm by weight to 5% by weight, based on the weight of the polymer.

The composition according to the present invention may contain an appropriate amount of inorganic filler, if required. Examples of the inorganic fillers may include metal oxide sol such as silica gel, zirconia sol, alumina sol or titania sol; silica materials such as silica sand, quartz, novaculite, diatomaceous earth or synthetic amorphous silica; silicates such as kaolinite, mica, wollastonite, asbestos, calcium silicate, aluminum silicate, zeolite, sepiolite or silicalite; glass materials such as glass powder, glass beads, glass bulbs, glass flakes, foamed glass beads or glass fibers; metal nitrides such as boron nitride, aluminum nitride, silicon nitride or titanium nitride; metal carbides such as boron carbide, aluminum carbide, silicon carbide or titanium carbide; metal borides such as titanium boride; metal carbonates such as calcium carbonate, magnesium carbonate or barium carbonate; metal oxides such as zinc oxide, alumina, magnesia, titania, zirconia or beryllium oxide; other inorganic compounds such as barium sulfate, molybdenum disulfide, tungsten sulfide or carbon fluoride; metal powder such as aluminum, bronze, lead, stainless steel or zinc; carbonaceous materials such as carbon black, cokes, graphite, pyrolytic carbon or hollow carbon beads; or the like. As the inorganic fillers, ultrafine particles of metal oxides such as zinc oxide, titanium oxide, aluminum oxide or zirconium oxide, and silica sol are especially preferable. These inorganic fillers can be used singly or in the form of a mixture of any two or more thereof. These inorganic fillers may have various shapes such as short fibers, granules or flakes. The average particle diameter of the inorganic filler used is in the range of 0.001 to 100 $\mu$m, preferably 0.001 to 1 $\mu$m.

The composition according to the present invention can further contain ordinary auxiliary components, if required. Examples of such auxiliary components may include pigments, leveling agents, anti-foaming agents, anti-static agents, ultraviolet absorbing agents, pH-controlling agents, dispersing agents, surface-modifying agents, plasticizers, drying-promoting agents, anti-sagging agents or the like. As the ultraviolet absorbing agents, zinc oxide, titanium oxide, cerium oxide or the like can be preferably used.

In order to produce a ceramic material from the powder polymer composition according to the present invention, after being formed into a required shape, the shaped product is brought into contact with steam. The shaping of the powder composition can be carried out by conventionally known methods such as a method of compressing the composition in a mold, a method of adhering a layer of the composition onto a surface of a solid body, or the like. The shaped product may have a variety of shapes such as film, plate, container, block, bar or rod or cylinder.

Also, in order to produce a ceramic material from the liquid composition according to the present invention, after being molded into a required shape, the shaped product is brought into contact with steam. The method of shaping the liquid composition can be carried out by conventionally known methods such as a method of shaping the composition in a mold and thereafter removing an organic solvent from the shaped product by vaporization thereof, a method of extruding and shaping the composition by an extruder and thereafter removing an organic solvent from the shaped product by vaporization thereof, a method of applying the composition onto a solid body to form a film thereon and thereafter removing an organic solvent from the film by vaporization thereof, or the like. The shaped product may be of various shapes such as film, fiber, plate, container, bar or rod or cylinder.

As the method of applying the liquid composition (coating material) on a surface of the solid body, there can be adopted various known methods such as immersion-coating, roll-coating, bar-coating, brush-coating, spray-coating, web-coating such as gravure-coating, kiss roll-coating, kiss mayer bar-coating, die-coating or flexo-coating, rotary coating, flow-coating or the like. The surface of the solid body onto which the liquid composition is applied, is preferably subjected to degreasing treatment or surface modifying treatments such as surface-roughening treatment to enhance the adhesion between the surface of the solid body and the composition to be applied.

As the method of bringing the thus-obtained shaped product made of the mixture of the polymer and the CPA into contact with steam, there can be adopted a method of bringing the shaped product into contact with steam ejected from a nozzle, a method of bringing the shaped product into contact with a steam-containing gas such as air or a nitrogen gas, or the like. The temperature at which the shaped product and steam are brought into contact with each other is in the range of 20 to 500° C., preferably 20 to 200° C., more preferably 30 to 100° C. The preferred method of contacting the shaped product and steam with each other is the afore-mentioned method of bringing the shaped product into contact with the steam-containing air. The steam-containing air may have a relative humidity of 0.1 to 100%, preferably 10 to 100%. The shaped product and the steam-containing air are contacted with each other for a period of time enough to transform the shaped product into a ceramic material. An optimum time during which the shaped product and steam are contacted with each other is varied depending upon the contact temperature, the relative humidity in the atmosphere in which the shaped product and steam are contacted with each other, or the like. For this reason, an appropriate contact time may be determined by conducting a simple preliminary experiment.

The shaped product made of the mixture of the polymer and the CPA can be transformed into a ceramic material at a temperature as low as not more than 50° C., or only by allowing the shaped product to stand in an atmosphere.

By bringing the shaped product into contact with steam, Si—N bonds, Si—H bonds and N—H bonds in the polymers of the shaped product all are eliminated with the simultaneous formation of new Si—O bonds, thereby producing a $SiO_2$-based ceramic material composed primarily of Si—O bonds.

The powdery composition and the liquid composition according to the present invention can be adhered to a surface of an optional solid body without any limitation. The solid bodies may be made of, for example, metal, plastic, glass, ceramic, wood, paper or the like.

Examples of the metal may include copper, nickel, cobalt, palladium, platinum, iron, tin, solder, titanium, stainless steel, a nickel alloy or the like.

The metal solid bodies may be solid products having various shapes such as film, fiber, bar or rod, cylinder or block. Specifically, the metal solid bodies may be various members such as mechanical components, electrical components and electronic components at least surface of which is made of metal.

The plastic solid bodies may be those formed from various resins or polymers such as a thermoplastic resin, a thermosetting resin, a photo-curable resin or a synthetic rubber. From the standpoint of a heat resistance and a solvent resistance, preferred plastic solid bodies may be those made of polyethylene terephthalate (PET), polyimide (PI; for example, a polycondensate of pyromellitic anhydride commercially available under the trade name "CAPTON", and diaminodiphenyl ether), polycarbonate (PC), a liquid crystal polymer, polypropylene, polyphenylene sulfide (PPS), polyethylene naphthalate (PEN), polyether sulfone (PES), polyether-imide (PEI), polyether-etherketone (PEEK), polyarylate (PAR), polystyrene, polyamide, polyamide-imide, polyvinyl chloride, polyester-based resins (e.g., "ISARYL" (registered trademark) produced by RONZA Corp.), an acrylic resin, polynorbornene-based resin (e.g., "ARTON" (registered trademark) produced by Nippon Synthetic Rubber Co., Ltd.), ZEONEX (produced by Nippon Zeon Co., Ltd. (registered trademark)), cellulose acetate, aromatic polyamide, norbornene-based polyolefin or the like.

The plastic solid bodies may be solid products having various shapes such as film, plate, bar or rod, cylinder, container, block or fiber. Specifically, the plastic solid bodies may be various members such as mechanical components, electrical components and electronic components at least surface of which is made of a plastic material.

The preferred plastic solid bodies are plastic films. The plastic films may be those formed from the afore-mentioned resins or polymers. These plastic films may be biaxially-stretched films or uniaxially-stretched films. The thickness of the film is not particularly restricted. In the case of films having an extremely small thickness, they can be supported on a substrate. Further, the plastic films can be subjected to surface-modifying treatments such as a corona-discharge treatment and a treatment with a silane-coupling agent or a surface-roughening treatment to enhance the adhesion between the composition and a surface of the solid body.

In the case where the composition according to the present invention is used to form a ceramic film on the plastic film, the formation of the ceramic film can be rapidly carried out at a low temperature, so that the plastic film can be prevented from being damaged.

The glass solid bodies maybe solid products having various shapes such as film, fiber, plate, bar or rod, cylinder, container or block.

The ceramic solid bodies may be those formed from metal oxides such as silica, alumina, titania or zirconia; metal nitrides such as silicon nitride, aluminum nitride, boron nitride, titanium nitride or zirconium nitride; metal carbides such as silicon carbide, boron carbide, titanium carbide or zirconium carbide; metal borides such as zirconium boride or titanium boride; or the like.

The ceramic solid bodies may be solid products having various shapes such as film, plate, bar or rod, cylinder, container, block or fiber.

The wood solid bodies may be solid products having various shapes such as plate, bar or rod, cylinder, container or block.

Other processes for the production of a ceramic material according to the present invention involve the process comprising impregnating the CPA into a shaped body made of silazane-based polymer but containing no CPA and bringing the shaped body into contact with steam, and the process comprising bringing a shaped body made of silazane-based polymer and containing no CPA into contact with a CPA-containing aqueous solution or with vapor of the CPA and steam, separately or simultaneously. The impregnation of the CPA into the shaped body may be carried out in such a manner that a liquid or gaseous CPA is brought into contact with the shaped body. The shaped body made of the silazane-based polymer may be produced by a method in which the powdery polymer is subjected to a powder-molding method, a method in which an solution of the polymer is subjected to a solution-molding method, or the like.

As the method for bringing the shaped body made of the silazane-based polymer unto contact with an aqueous solution of the CPA, there can be adopted a immersion method in which the shaped body is immersed in the aqueous solution of the CPA, a spraying method in which the aqueous solution of the CPA is sprayed onto a surface of the shaped body through a nozzle, or the like. The concentration of the CPA in the aqueous solution is not particularly restricted as far as it is not less than 0.1 ppm by weight. The concentration of the CPA in the aqueous solution is preferably in the range 10 ppm by weight to 10% by weight.

As the method for bringing the shaped body made of the silazane-based polymer into contact with steam, there can be adopted a method in which the shaped body is brought into contact with a CPA vapor being ejected through a nozzle, a method in which a gas (e.g., air, a nitrogen gas or the like) containing the CPA vapor is brought into contact with the shaped body, a method in which a mixed vapor composed of the CPA vapor vaporized from the aqueous CPA solution and steam is brought into contact with the shaped body, or the like. The temperature at which the shaped body and the CPA vapor are brought into contact with each other, is in the range of 20 to 500° C., preferably 20 to 200° C., more preferably 30 to 100° C. The time for which the shaped body and the CPA vapor are brought into contact with each other, is in the range of about 10 to about 60 minutes. It is preferred that the contact between the shaped body and the CPA vapor be conducted by the method of bringing the gas (e.g., air, a nitrogen gas or the like) containing the CPA vapor is brought into contact with the shaped body. The concentration of the CPA vapor in the gas containing the CPA vapor is not particularly restricted but may be not less than 1 ppm by volume, preferably in the range of 1 to 50% by volume.

The preferred method for generating the CPA vapor may be a method in which a carrier gas such as air or a nitrogen gas is blown into the aqueous CPA solution such that the solution is caused to be bubbled. According to this method, there can be produced a mixed gas composed of the CPA vapor, steam and the carrier gas. In this case, if the amine compound is used as the CPA, the concentration of the CPA in the aqueous CPA solution may be not less than 10 ppm by weight, preferably in the range of 100 ppm by weight to 50% by weight, more preferably 0.1 to 20% by weight.

On the other hand, if the acid compound or the peroxide is used as the CPA, the concentration of the CPA in the aqueous CPA solution may be not less than 0.1 ppm by weight, preferably 10 ppm by weight to 10% by weight, more preferably 100 ppm by weight to 1% by weight. The temperature of the CPA solution at which the carrier gas is blown thereinto is not particularly restricted but may be in the range of 0° C. to a boiling point of the aqueous solution.

As the method for bringing the shaped body into contact with steam, there can be adopted various method mentioned above.

In the case where the shaped body is brought into contact with the CPA vapor and steam, there can be adopted a method in which the shaped body is brought into contact first with the CPA vapor and then with steam, a method in which the shaped body is simultaneously brought into contact with the CPA vapor and steam, or the like. The simultaneous contact of the shaped body with the CPA vapor and steam can be accomplished by bringing the mixed gas composed of the CPA vapor, steam and the carrier gas, which is produced by blowing a bubbling gas into the aqueous CPA solution into contact with the shaped body.

In the case where the shaped body is brought into contact with the CPA vapor and steam, the contact therebetween can be carried out by introducing the CPA solution and the steam into a drying zone in which an undried shaped body is dried. In this case, the drying of the shaped body can be performed simultaneously with the contact between the shaped body and the CPA vapor and between the shaped body and steam.

As described above, the polymer constituting the shaped body can be transformed into a ceramic material by bringing the CPA vapor and the steam into contact with the shaped body. Further, the shaped body thus transformed into a ceramic material can be brought into contact with steam, water, an aqueous alkaline solution or an aqueous acid solution, if required, to enhance the ceramic-transformation.

One of the preferred embodiments of the present invention involves a process for forming a ceramic film as an insulating film or a protective film on a surface of each of various substrates or devices used in electronic products. In this case, as the process for forming the ceramic film, the afore-mentioned processes can be used.

Examples of the afore mentioned substrates may include those for semiconductor devices or liquid crystal devices. As the substrates for semiconductor devices, semiconductor-mounting substrates, printed-wiring boards or the like are exemplified. These substrates may be silicon plates, glass plates, alumina plates, plastic films or the like. As the elements used in the semiconductor device, semiconductor elements, capacitor elements, resistor elements or the like are exemplified. On the other hand, as the substrates for liquid crystal devices, display panels are exemplified. The display panels may be glass plates, silicon plates, plastic films or the like. As elements used in the liquid crystal devices, transparent electrode plates, pixel electrodes, color filters or the like are exemplified. In accordance with the present invention, the transformation of the polymer into the ceramic film can be carried out at a temperature as low as not more than 100° C., so that the ceramic film can be formed on a surface of each of these substrates or elements without damage thereto.

Another preferred embodiment of the present invention involves a process for forming a ceramic film on a surface of a plastic film. In this case, the formation of the ceramic film can be carried out by the afore-mentioned method. Since the process according to the present invention can be performed at a temperature as low as not more than 100° C., the ceramic film can be formed on the surface of the plastic film without damage thereto.

A further preferred embodiment of the present invention involves the process for forming a ceramic film on a solid product, which comprises the continuous steps of applying a coating material containing a silazane-based polymer on the solid product to form a film of the coating material on the solid product, drying the film of the coating material applied on the solid product to form a dried polymer film, and transforming the polymer film into a ceramic material. The transformation of the polymer film into the ceramic film can be performed by the afore-mentioned method. That is, in the case where a coating material containing the silazane-based polymer and the CPA is used as the coating material applied, the ceramic transformation process can be conducted by bringing the polymer film into contact with steam. On the other hand, in the case where a coating material containing no CPA is used as the coating material applied, the ceramic transformation process can be performed by bringing the polymer film into contact with either the aqueous CPA solution or the CPA vapor, and with steam separately or simultaneously.

In accordance with the present invention, since the ceramic transformation process can be rapidly carried out at a temperature as low as not more than 100° C., the ceramic film can be effectively formed not only on solid bodies having a high heat-resistance but also those having a deteriorated heat resistance.

The afore-mentioned drying step and ceramic-transformation step can be carried out separately or simultaneously. As processes for performing these two steps simultaneously, there can be adopted the following processes:

(1) In the case of the coating material containing CPA:

In the case where the coating material containing both the polymer and the CPA is used, there can be adopted a process in which steam is introduced during the drying step to cause the film of the coating material to be dried in the presence of steam. This process enables both the drying step and the ceramic-transformation step to be conducted simultaneously. In order to carry out this process in a suitable manner, steam is introduced into a drying zone for drying the film of the coating material formed on the solid product, to adjust a relative humidity in the drying zone to a range of 10 to 100% RH, preferably 50 to 100% RH, and then the solid product having the film of the coating material is passed through the drying zone for a residence time of 5 to 60 minutes.

(2) In the case of the coating material containing no CPA:

In the case where the coating material containing no CPA is used, there can be adopted a process in which the vapor of the CPA and steam are introduced in the drying region and the film of the coating material is dried in the presence of the vapor of the CPA and steam.

In order to carry out this method in a suitable manner, the CPA vapor and steam are introduced into the drying zone for drying the film of the coating material formed on the solid product, so as to produce the drying zone maintained at relative humidity of 10 to 100% RH, preferably 50 to 100% RH, and a temperature of 30 to 100° C., and then the solid product having the film of the coating material is passed through the drying zone for a residence time of 5 to 60 minutes.

When the CPA vapor and steam are introduced into the drying zone, they can be supplied separately or in the form of a mixed gas containing both the CPA vapor and steam. In order to obtain the mixed gas of the CPA vapor and steam, a carrier gas can be blown into an CPA-containing aqueous solution to cause bubbling of the aqueous solution. When the carrier gas passes through the aqueous solution, the CPA vapor and steam are entrained by the carrier gas. The carrier gas containing the CPA vapor and steam is introduced into the drying zone to dry the film of the coating material. As the carrier gases, there can be used inert gases such as a nitrogen gas, or air.

In accordance with the present invention, the solid product is allowed to pass, in turn, through the coating process region, the drying process region and the ceramic transformation process region, thereby producing the solid product having the ceramic film. The thus-produced product whose surface is composed of the ceramic film may be further subjected to post-treatments such as a steam-contact treatment, a water-contact treatment, an acid-contact treatment or a basic compound-contact treatment, if required, to enhance the degree of ceramic-transformation of the ceramic film. Also, when the above-produced solid product whose surface is composed of the ceramic film is allowed to stand in an atmosphere, the degree of ceramic transformation of the ceramic film can be further enhanced.

A still further preferred embodiment of the present invention involve a process which comprises the sequential steps of applying a coating material containing a silazane-based polymer on a surface of a solid body to form a film of the coating material on the solid body, drying the film of the coating material to form a polymer film on the solid body, adding a vapor or liquid of CPA into the polymer film by bringing the polymer film into contact with the vapor or liquid of CPA, and bringing the polymer film into contact with steam to transform the polymer film into the ceramic film. In this process, the drying step and the CPA-adding step can be conducted simultaneously by allowing the CPA to be present in the drying step. Similarly, the CPA-adding step and the ceramic-transformation step can be conducted simultaneously by allowing steam to be present in the CPA-adding step.

As the solid products, various kinds of solid members can be used. Especially, elongated plastic films can be advantageously used. In order to produce a ceramic film on one or both of opposite surfaces of the elongated plastic film, the plastic film is allowed to be transported, in turn, through a coating zone, a drying zone and a ceramic-transformation zone. The thus-produced film product is wound into a roll.

The thickness of the ceramic film formed on the solid body is in the range of 50 Å to 5 $\mu$m, preferably 100 Å to 2 $\mu$m. When the thickness of the ceramic film is more than 5 $\mu$m, the ceramic film tends to suffer from cracks and is also deteriorated in flexibility. On the other hand, when the thickness of the ceramic film is less than 50 Å, the ceramic film cannot exhibit a sufficient function.

Further, the content of nitrogen in the ceramic film formed on the solid body is in the range of 0.005 to 5 atomic %. When the content of nitrogen is more than 5 atomic %, the degree of ceramic transformation of the ceramic film becomes insufficient, so that the ceramic film cannot exhibit a sufficient function. The content of nitrogen in the ceramic film can be controlled by varying the conditions of the ceramic transformation.

When an amine compound is used as the CPA, a residue of the amine compound is occasionally present on the ceramic film. The amount of the residual amine compound in the ceramic film can be controlled by varying the sort of amine compound used and the conditions of the ceramic transformation, thereby obtaining a film containing no residual amine compound.

EXAMPLES

The present invention is described in detail below by way of examples. However, these examples are not intended to limit the technical scope of the present invention.

Reference Example 1

Synthesis of Perhydropolysilazane

A four-necked flask having a capacity of one liter was equipped with a gas feed pipe, a mechanical stirrer and a Dewar condenser. After an interior of the four-necked flask as a reactor was replaced with a deoxygenated dry nitrogen gas, 490 ml of deoxygenated dry pyridine was charged into the flask and the content in the flask was cooled with ice. Successively, when 51.9 g of dichlorosilane was added to the mixture in the flask, a white solid adduct ($SiH_2Cl_2.2C_5H_5N$) was produced. The resultant reaction mixture is cooled with ice and 51.0 g of purified ammonia was blown into the flask through a sodium hydroxide pipe and an active carbon pipe while stirring. Thereafter, the mixture in the flask was heated at 100° C.

After completion of the reaction, the reaction mixture was removed by centrifugal separation and washed with dry pyridine. Further, the reaction mixture was filtered in a dry nitrogen atmosphere so that 850 ml of a filtrate was obtained. 5 ml of the filtrate was placed under a reduced pressure to remove a solvent therefrom, so that 0.102 g of resinous solid perhydropolysilazane was obtained.

The thus-obtained polymer had a number-average molecular weight of 1,120 when measured according to a cryoscopy (solvent: dry benzene). Also, the infra-red absorption spectrogram of the polymer (solvent: dry o-xylene; concentration of perhydropolysilazane: 10.2 g/l) revealed that the absorptions occurred at a wave-number of 3390 ($cm^{-1}$) and 1180 based on N—H, at a wave-number of 2170 based on Si—H and at wave-number of 1040 to 800 based on Si—N—Si, respectively.

Reference Example 2

Synthesis of Polymethyl-(hydro)-silazane

A four-necked flask having a capacity of 500 milliliters was equipped with a gas feed pipe, a mechanical stirrer and a Dewar condenser. After an interior of the four-necked flask as a reactor was replaced with a deoxygenated dry nitrogen gas, 24.3 g of methyl dichlorosilane ($CH_3SiHCl_2$: 0.221 mol) and 300 ml of dry dichloromethane were charged into the flask. The resultant reaction mixture is cooled with ice and 20.5 g (1.20 mol) of dry ammonia in the form of a mixed gas with a nitrogen gas was blown into the flask while stirring to conduct ammonolysis of the reaction mixture.

After completion of the reaction, the reaction mixture was removed by centrifugal separation and then filtered. The filtrate was placed under a reduced pressure to remove a solvent therefrom, so that 8.79 g of polymethyl(hydro)-silazane as a colorless liquid was obtained.

The reaction product had a number average molecular weight of 310 when measured by cryoscope (solvent: dry benzene).

Next, a four-necked flask having a capacity of 100 ml was equipped with a gas feed pipe, a thermometer, a condenser and a dropping funnel. An interior of the reaction system was replaced with an argon gas. 12 ml of tetrahydrofuran and 0.189 g (4.71 mol) of potassium hydroxide were charged into the four-necked flask and then magnetic stirring of the mixture was initiated. 5.00 g of the above prepared-polymethyl (hydro)-silazane and 50 ml of dry tetrahydrofuran were charged into the dropping funnel and dropped through the dropping funnel in a mixed liquid of potassium hydroxide and tetrahydrofuran. After the mixture was reacted at room temperature for one hour, 1.60 g (11.3 mmol) of methane iodide and 1 ml of dry tetrahydrofuran were charged into the dropping funnel and dropped through the dropping funnel in the reaction solution. The reaction mixture is reacted at room temperature for three hours and then placed under a reduced pressure to remove a solvent therefrom. The reaction mixture was supplied with 40 ml of dry n-hexane and subjected to centrifugal separation. Successively, the reaction mixture was filtered to obtain a filtrate and then the filtrate was placed under a reduced pressure to remove a solvent therefrom, so that 4.85 g of polymethyl (hydro) silazane as a white powder was obtained.

The thus-obtained polymer had a number-average molecular weight of 1,060. Also, the infra-red absorption spectrogram of the polymer (solvent: dry o-xylene; concentration of polymethyl(hydro)silazane: 43.2 g/l) revealed that the absorptions occurred at a wave-number of 3380 ($cm^{-1}$) and 1170 based on N—H, at a wave-number of 2140 based on Si—H, and at wave-number of 1250 based on Si—$CH_3$.

Comparative Example 1

Perhydropolysilazane synthesized in Reference Example 1 was dissolved in xylene to prepare a solution containing 20 wt. % of perhydropolysilazane. The solution was applied onto a surface of a silicon wafer having a diameter of 4 inches and a thickness of 0.5 mm by using a spin-coater. (at 1000 rpm for 20 seconds) and then dried at room temperature for 30 minutes. It was confirmed that the thus-prepared film exhibited a IR spectrum identical to that of the above-prepared perhydropolysilazane, Successively, the perhydropolysilazane-coated silicon substrate was placed in a thermo-hygrostat maintained at a temperature of 95° C. and a relative humidity of 80% to conduct a moistening treatment thereof.

The thus-obtained film was measured for IR spectrum. The infra-red absorption spectrogram of the film revealed that the absorptions at a wave-number of 3350 ($cm^{-1}$) and 1200 based on N—H, at a wave-number of 2190 based on Si—H, and at wave-number of 1020 to 820 based on Si—N—Si still remained to a considerable extent.

Example 1

Perhydropolysilazane synthesized in Reference Example 1 was dissolved in xylene to prepare a solution containing 20 wt. % of perhydropolysilazane. 20 mg of propionic acid and 500 mg of tributyl amine were gradually added to 10 g of the solution at room temperature while stirring. The solution was applied onto a surface of a silicon wafer having a diameter of 4 inches and a thickness of 0.5 mm by using a spin-coater (at 1000 rpm for 20 seconds). The wafer was placed in a thermo-hygrostat maintained at a temperature of 50° C. and a relative humidity of 80% and subjected to moistening treatment for three hours.

The thus-obtained film was measured for IR spectrum. The IR spectrum atlas of the film revealed that the absorptions at a wave-number of 3390 ($cm^{-1}$) and 1180 based on N—H, at a wave-number of 2170 based on Si—H, and at wave-number of 1040 to 800 based on Si—N—Si all were dissipated completely. Instead, it was confirmed that the absorption occurred at a wave-number of 3700 to 3100 based on O—H and at wave-number of 1180 and 460 based on Si—O, respectively.

The thus-obtained film was measured for an acid corrosion rate (etching rate) to evaluate a denseness thereof. The measurement revealed that the etching rate of the film was 1,100 Å/min and therefore the film had a high denseness.

The afore-mentioned etching rate of the film was determined as follows.

A sample film was immersed in a corrosive liquid prepared by mixing 100 ml of 60 wt. % nitric acid and 1 ml of 50 wt. % hydrofluoric acid, for 2 minutes. Thereafter, the thickness of the film was measured by an elipsometer to calculate reduction in thickness of the film. Based on the thus calculated reduction in thickness of the film, the etching rate (Å/min) of the film was determined.

Example 2

Polymethyl(hydro)silazane synthesized in Reference Example 2 was dissolved in xylene to prepare a solution containing 20 wt. % of polymethyl(hydro)silazane. 20 mg of propionic acid and 500 mg of tributyl amine were gradually added to 10 g of the solution at room temperature while stirring. The solution was applied onto a surface of a silicon wafer having a diameter of 4 inches and a thickness of 0.5 mm by using a spin-coater (at 1000 rpm for 20 seconds) The wafer was placed in a thermo-hygrostat maintained at a temperature of 50° C. and a relative humidity of 80% and subjected to moistening treatment for three hours.

The thus-obtained film was measured for IR spectrum. The IR spectrum atlas of the film revealed that the absorptions at a wave-number of 3380 ($cm^{-1}$) and 1170 based on N—H and at a wave-number of 2140 based on Si—H all were dissipated completely. Instead, it was confirmed that the absorption occurred at a wave-number of 3700 to 3300 based on O—H at a wave number of 1270 based on Si—$CH_3$ and at wave-number of 1130 and 440 based on Si—O, respectively.

The thus-obtained film was measured for an acid corrosion rate (etching rate) to evaluate a denseness thereof. The measurement revealed that the etching rate of the film was 1,500 Å/min.

Example 3

Perhydropolysilazane synthesized in Reference Example 1 was dissolved in xylene to prepare a solution containing 20 wt. % of perhydropolysilazane. 20 mg of acetic acid and 500 mg of tributyl amine were gradually added to 10 g of the solution at room temperature while stirring. The solution was applied onto a surface of a silicon wafer having a diameter of 4 inches and a thickness of 0.5 mm by using a spin-coater (at 1000 rpm for 20 seconds) The wafer was placed in a thermo-hygrostat maintained at a temperature of 50° C. and a relative humidity of 80% and subjected to moistening treatment for three hours.

The thus-obtained film was measured for IR spectrum. The IR spectrum atlas of the film revealed that the absorptions at a wave-number of 3390 ($cm^{-1}$) and 1180 based on N—H, at a wave-number of 2170 based on Si—H, and at wave-number of 1040 to 800 based on Si—N—Si all were dissipated completely. Instead, it was confirmed that the absorption occurred at a wave-number of 3700 to 3100 based on O—H and at wave-number of 1190 and 460 based on Si—O, respectively.

The thus-obtained film was measured for an acid corrosion rate (etching rate) to evaluate a denseness thereof. The measurement revealed that the etching rate of the film was 1000 Å/min.

Example 4

Perhydropolysilazane synthesized in Reference Example 1 was dissolved in xylene to prepare a solution containing 20 wt. % of perhydropolysilazane. 20 mg of propionic acid and 500 mg of dipentyl amine were gradually added to 10 g of the solution at room temperature while stirring. The solution was applied onto a surface of a silicon wafer having a diameter of 4 inches and a thickness of 0.5 mm by using a spin-coater (at 1000 rpm for 20 seconds) The wafer was placed in a thermo-hygrostat maintained at a temperature of 50° C. and a relative humidity of 80% and subjected to moistening treatment for three hours.

The thus-obtained film was measured for IR spectrum. The IR spectrum atlas of the film revealed that the absorptions at a wave-number of 3390 ($cm^{-1}$) and 1180 based on N—H, at a wave-number of 2170 based on Si—H, and at wave-number of 1040 to 800 based on Si—N—Si all were dissipated completely. Instead, it was confirmed that the absorption occurred at a wave-number of 3700 to 3000 based on O—H and at wave-number of 1180 and 460 based on Si—O respectively.

The thus-obtained film was measured for an acid corrosion rate (etching rate) to evaluate a denseness thereof. The measurement revealed that the etching rate of the film was 1,200 Å/min.

Example 5

Perhydropolysilazane synthesized in Reference Example 1 was dissolved in xylene to prepare a solution containing 20 wt. % of perhydropolysilazane. 100 mg of propionic acid was gradually added to 10 g of the solution at room temperature while stirring. The solution was applied onto a surface of a silicon wafer having a diameter of 4 inches and a thickness of 0.5 mm by using a spin-coater (at 1000 rpm for 20 seconds) The wafer was placed in a thermo-hygrostat maintained at a temperature of 95° C. and a relative humidity of 80% and subjected to moistening treatment for five hours.

The thus-obtained film was measured for IR spectrum. The IR spectrum atlas of the film revealed that the absorptions at a wave-number of 3390 ($cm^{-1}$) and 1180 based on N—H, at a wave-number of 2170 based on Si—H, and at wave-number of 1040 to 800 based on Si—N—Si were almost all dissipated. Instead, it was confirmed that the weak absorption occurred at a wave-number of 2170 based on Si—H, and that the absorptions occurred at a wave-number of 3700 to 3200 based on O—H and at wave-number of 1180 and 460 based on Si—O respectively.

Example 6

Perhydropolysilazane synthesized in Reference Example 1 was dissolved in xylene to prepare a solution containing 20 wt. % of perhydropolysilazane. 50 mg of tripentyl amine was gradually added to 10 g of the solution at room temperature while stirring. The solution was applied onto a surface of a silicon wafer having a diameter of 4 inches and a thickness of 0.5 mm by using a spin-coater (at 1000 rpm for 20 seconds) The wafer was placed in a thermo-hygrostat maintained at a temperature of 95° C. and a relative humidity of 80% and subjected to moistening treatment for one hour.

The thus-obtained film was measured for IR spectrum. The IR spectrum atlas of the film revealed that the absorptions at a wave-number of 3390 ($cm^{-1}$) and 1180 based on N—H, at a wave-number of 2170 based on Si—H, and at wave-number of 1040 to 800 based on Si—N—Si were almost all dissipated. Instead, it was confirmed that the weak absorption occurred at a wave-number of 2170 based on Si—H, and that the absorption occurred at a wave-number of 3700 to 3000 based on O—H and at wave-number of 1170 and 450 based on Si—O respectively.

Further, when FT-IR was integrated to reduce noises and the wave-number region near at 2900 $cm^{-1}$ was magnified, it was confirmed that a weak absorption occurred at a wave-number of 2820 to 2950 $cm^{-1}$ based on C—H of tripentyl amine.

Example 7

Perhydropolysilazane synthesized in Reference Example 1 was dissolved in xylene to prepare a solution containing 20 wt. % of perhydropolysilazane. The solution was applied onto a surface of a silicon wafer having a diameter of 4 inches and a thickness of 0.5 mm by using a spin-coater (at 1000 rpm for 20 seconds) Next, 50 g of triethyl amine and 950 g of pure water were charged in a 2000 ml beaker and heated while stirring to 50° C. by a mantled heater. The silicon wafer on which perhydropolysilazane was coated, was immersed in the liquid in the beaker for 15 minutes.

The thus-obtained film was measured for IR spectrum. The IR spectrum atlas of the film revealed that the absorptions at a wave-number of 3390 ($cm^{-1}$) and 1180 based on N—H, at a wave-number of 2170 based on Si—H, and at wave-number of 1040 to 800 based on Si—N—Si were almost all dissipated. Instead, it was confirmed that the absorption occurred at a wave-number of 3600 to 3100 based on O—H and at wave-number of 1000 to 1250 and 440 based on Si—O respectively.

The thus-obtained film was measured for an acid corrosion rate (etching rate) to evaluate a denseness thereof. The measurement revealed that the etching rate of the film was 2,500 Å/min.

Example 8

Perhydropolysilazane synthesized in Reference Example 1 was dissolved in xylene to prepare a solution containing 20 wt. % of perhydropolysilazane. The solution was applied onto a surface of a silicon wafer having a diameter of 4 inches and a thickness of 0.5 mm by using a spin-coater. (at 1000 rpm for 20 seconds) Next, 50 g of n-butyl amine and 950 g of pure water were charged in a 2000 ml beaker and stirred at room temperature (20° C.). The silicon wafer on which perhydropolysilazane was coated, was immersed in the aqueous solution in the beaker for one hour.

The thus-obtained film was measured for IR spectrum. The IR spectrum atlas of the film revealed that the absorptions at a wave-number of 3390 (cm$^{-1}$) and 1180 based on N—H, at a wave-number of 2170 based on Si—H, and at wave-number of 1040 to 800 based on Si—N—Si all were decreased. Instead, it was confirmed that the absorption occurred at a wave-number of 3600 to 3200 based on O—H and at wave-number of 1000 to 1250 and 460 based on Si—O respectively.

The thus-obtained film was measured for an acid corrosion rate (etching rate) to evaluate a denseness thereof. The measurement revealed that the etching rate of the film was 3000 Å/min.

Example 9

Perhydropolysilazane synthesized in Reference Example 1 was dissolved in xylene to prepare a solution containing 20 wt. % of perhydropolysilazane. The solution was applied onto a surface of a silicon wafer having a diameter of 4 inches and a thickness of 0.5 mm by using a spin-coater (at 1000 rpm for 20 seconds) Next, 5 g of acetic acid, 50 g of n-pentyl amine and 950. g of pure water were charged in a 2000 ml beaker and heated to 50° C. by a mantled heater while stirring. The silicon wafer on which perhydropolysilazane was coated, was immersed in the aqueous solution in the beaker for one hour.

The thus-obtained film was measured for IR spectrum. The IR spectrum atlas of the film revealed that the absorptions at a wave-number of 3390 (cm$^{-1}$) and 1180 based on N—H, at a wave-number of 2170 based on Si—H, and at wave-number of 1040 to 800 based on Si—N—Si were almost all dissipated. Instead, it was confirmed that the absorption occurred at a wave-number of 3600 to 3100 based on O—H and at wave-number of 1000 to 1250 and 440 based on Si—O respectively.

The thus-obtained film was measured for an acid corrosion rate (etching rate) to evaluate a denseness thereof. The measurement revealed that the etching rate of the film was 2,200 Å/min.

Example 10

Perhydropolysilazane synthesized in Reference Example 1 was dissolved in xylene to prepare a solution containing 20 wt. % of perhydropolysilazane. The solution was applied onto a surface of a silicon wafer having a diameter of 4 inches and a thickness of 0.5 mm by using a spin-coater (at 1000 rpm for 20 seconds) Next, 5 g of triethyl amine and 95 g of pure water were charged in a 2000 ml beaker and heated to 50° C. by a mantled heater while stirring. The silicon wafer on which perhydropolysilazane was coated, was suspended in a gas phase portion in the beaker for 30 minutes.

The thus-obtained film was measured for IR spectrum. The IR spectrum atlas of the film revealed that the absorptions at a wave-number of 3390 (cm$^{-1}$) and 1180 based on N—H, at a wave-number of 2170 based on Si—H, and at wave-number of 1040 to 800 based on Si—N—Si were almost all dissipated. Instead, it was confirmed that the absorption occurred at a wave-number of 3600 to 3100 based on O—H and at wave-number of 1000 to 1250 and 450 based on Si—O respectively.

The thus-obtained film was measured for an acid corrosion rate (etching rate) to evaluate a denseness thereof. The measurement revealed that the etching rate of the film was 2,200 Å/min.

Example 11

Perhydropolysilazane synthesized in Reference Example 1 was dissolved in xylene to prepare a solution containing 20 wt. % of perhydropolysilazane. The thus-prepared solution was applied onto a surface of a silicon wafer having a diameter of 4 inches and a thickness of 0.5 mm by using a spin-coater (at 1000 rpm for 20 seconds) Separately, 1000 g of 30% hydrogen peroxide was charged in a 2000 ml beaker and heated to 50° C. by a mantled heater while stirring. The silicon wafer on which perhydropolysilazane was coated, was immersed in the aqueous hydrogen peroxide solution in the beaker for 30 minutes.

The thus-obtained film was measured for IR spectrum. The IR spectrum atlas of the film revealed that almost all of the absorptions at a wave-number of 3390 (cm$^{-1}$) and 1180 based on N—H, at a wave-number of 2170 based on Si—H, and at wave-number of 1040 to 800 based on Si—N—Si were dissipated. Instead, it was confirmed that the absorption occurred at a wave-number of 3600 to 2900 based on O—H and at wave-number of 1000 to 1300 and 450 based on Si—O respectively.

The thus-obtained film was measured for an acid corrosion rate (etching rate) to evaluate a denseness thereof. The measurement revealed that the etching rate of the film was 2,000 Å/min.

Reference Example 3

Synthesis of Polymethyl(hydro)-silazane

A four-necked flask having a capacity of 500 milliliters was equipped with a gas feed pipe, a mechanical stirrer and a Dewar condenser. After an interior of the four-necked flask as a reactor was replaced with dry deoxygenated nitrogen, 24.3 g (0.221 mol) of methyl dichlorosilane (CH$_3$SiHCl$_2$) and 300 ml of dry dichlorosilane were charged into the four-necked flask. The resultant reaction mixture is cooled with ice and 20.5 g (1.20 mol) of dry ammonia together with a nitrogen gas was blown into the flask while stirring.

After completion of the reaction, the reaction mixture was subjected to centrifugal separation and then filtered. The filtrate was placed under a reduced pressure to remove a solvent therefrom, so that 8.79 g of polymethyl(hydro)-silazane as a colorless liquid was obtained.

Comparative Example 2

Perhydropolysilazane synthesized in Reference Example 1 was dissolved in decahydronaphthalene to prepare a solution containing 20 wt. % of perhydropolysilazane. The solution was spin-coated onto surfaces of a silicon plate and a glass plate at 3000 rpm for 20 seconds in an atmosphere (25° C., 50% RH). These silicon and glass plates were placed in a thermo-hygrostat maintained at a temperature of 95° C. and a relative humidity of 80% and subjected to moistening treatment for ten hours. The thus-obtained film was measured for an acid corrosion rate (etching rate) to evaluate a denseness thereof. The measurement revealed that the etching rate of the films was not less than 10,000

Å/min. Further, the obtained films were observed by a microscope (×120). The observation revealed that the films had many irregularities thereon and therefore were uneven in quality.

Comparative Example 3

Perhydropolysilazane synthesized in Reference Example 1 was dissolved in decahydronaphthalene to prepare a solution containing 20 wt. % of perhydropolysilazane. The solution was spin-coated onto surfaces of a silicon plate and a glass plate at 3000 rpm for 20 seconds in an atmosphere (25° C., 50% RH).

These plates were heated on a hot plate maintained at 250° C. for 3 minutes. At this time, a large amount of smoke was generated and the weight of each of the respective films on the silicon and glass plates after heating was 75% of that before heating. Further, the films on the respective plates were calcined at 450° C. for one hour in an atmosphere. The thus-obtained films were measured for an acid corrosion rate (etching rate) to evaluate a denseness thereof. The measurement revealed that the etching rate of each of the films was not less than 10,000 Å/min. Further, the obtained films were observed by a microscope (×120). The observation revealed that the films had many irregularities and spherical pores (1 to 10 μm) and therefore were uneven in quality.

Comparative Example 4

Polymethyl(hydro)silazane synthesized in Reference Example 3 was dissolved in xylene to prepare a solution containing 20 wt. % of polymethyl(hydro)silazane. The solution was spin-coated onto surfaces of a silicon plate and a glass plate at 3000 rpm for 20 seconds in an atmosphere (25° C., 50% RH). These silicon and glass plates were placed in a thermo-hygrostat maintained at a temperature of 95° C. and a relative humidity of 80% and subjected to moistening treatment for ten hours. The thus-obtained films were measured for an acid corrosion rate (etching rate) to evaluate a denseness thereof. The measurement revealed that the etching rate of each of the films was not less than 10,000 Å/min. Further, the obtained films were observed by a microscope (×120). The observation revealed that the films had many irregularities thereon and therefore were uneven in quality.

Comparative Example 5

Polymethyl(hydro)silazane synthesized in Reference Example 3 was dissolved in xylene to prepare a solution containing 20 wt. % of polymethyl(hydro)silazane. The solution was spin-coated onto surfaces of a silicon plate and a glass plate at 3000 rpm for 20 seconds in an atmosphere (25° C., 50% RH). These plates were heated on a hot plate maintained at 250° C. for 3 minutes in an atmosphere (25° C., 50% RH).

At this time, a large amount of smoke was generated and the weight of each of the respective films on the silicon and glass plates after heating was 75% of that before heating. Further, the films on the respective plates were calcined at 450° C. for one hour in an atmosphere. The thus-obtained films were measured for an acid corrosion rate (etching rate) to evaluate a denseness thereof. The measurement revealed that the etching rate of each of the films was 12,000 Å/min. Further, the obtained films were observed by a microscope (×120). The observation revealed that the films had many irregularities and spherical pores (1 to 10 μm) and therefore were uneven in quality.

Example 12

Perhydropolysilazane synthesized in Reference Example 1 was dissolved in decahydronaphthalene to prepare a solution containing 20 wt. % of perhydropolysilazane. 200 mg of tri-n-pentyl amine was gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were placed in a thermo-hygrostat maintained at a temperature of 95° C. and a relative humidity of 80% and subjected to moistening treatment for one hour. The thus-obtained films were measured for an acid corrosion rate (etching rate) to evaluate a denseness thereof. The measurement revealed that the etching rate of each of the films was 1,500 Å/min. Further, the obtained films were observed by a microscope (×120). The observation revealed that the films had no irregularities thereon and therefore were uniform in quality.

Example 13

Perhydropolysilazane synthesized in Reference Example 1 was dissolved in decahydronaphthalene to prepare a solution containing 20 wt. % of perhydropolysilazane. 200 mg of tri-n-pentyl amine was gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). The silicon and glass plates were heated on a hot plate maintained at 250° C. for 3 minutes in an atmosphere (25° C., 50% RH). At this time, no smoke was generated and the weight of each of the films on the silicon and glass plates after heating was 102% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 800 Å/min. Further, the obtained films were observed by a microscope (×120). The observation revealed that the films had no irregularities and no spherical pores and therefore were uniform in quality.

Example 14

Polymethyl (hydro) silazane synthesized in Reference Example 3 was dissolved in xylene to prepare a solution containing 20 wt. % of polymethyl(hydro)silazane. 200 mg of tri-n-pentyl amine was gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were placed in a thermo-hygrostat maintained at a temperature of 95° C. and a relative humidity of 80% and subjected to moistening treatment for one hour. The thus-obtained films were measured for an acid corrosion rate (etching rate) to evaluate a denseness thereof. The measurement revealed that the etching rate of each of the films was 1,600 Å/min. Further, the obtained films were observed by a microscope (×120). The observation revealed that the films had no irregularities and therefore were uniform in quality.

Example 15

Polymethyl(hydro)silazane synthesized in Reference Example 3 was dissolved in xylene to prepare a solution containing 20 wt. % of polymethyl(hydro)silazane. 200 mg of tri-n-pentyl amine was gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were heated on a hot plate maintained at 250° C. for 3 minutes in an atmosphere (25° C., 50% RH). At this time, no smoke was generated and the weight of each of the films on the silicon and glass plates after heating was 99% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 1,100 Å/min. Further, the obtained films were observed by a microscope (×120). The observation revealed that the films had no irregularities and no spherical pores (1 to 10 μm) and therefore were uniform in quality.

Example 16

Perhydropolysilazane synthesized in Reference Example 1 was dissolved in decahydronaphthalene to prepare a solution containing 20 wt. % of perhydropolysilazane. 20 mg of propionic acid and 500 mg of dibutyl amine were gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were placed in a thermo-hygrostat maintained at a temperature of 95° C. and a relative humidity of 80% and subjected to moistening treatment for one hour. The thus-obtained films were measured for an acid corrosion rate (etching rate) to evaluate a denseness thereof. The measurement revealed that the etching rate of each of the films was 1,500 Å/min. Further, the obtained films were observed by a microscope (×120). The observation revealed that the films had no irregularities and therefore were uniform in quality.

Example 17

Perhydropolysilazane synthesized in Reference Example 1 was dissolved in decahydronaphthalene to prepare a solution containing 20 wt. % of perhydropolysilazane. 20 mg of propionic acid and 500 mg of dibutyl amine were gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were heated on a hot plate maintained at 250° C. for 3 minutes in an atmosphere (25° C., 50% RH). At this time, no smoke was generated and the weight of each of the films on the silicon and glass plates after heating was 101% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 700 Å/min. Further, the obtained films were observed by a microscope (×120). The observation revealed that the films had no irregularities and no spherical pores (1 to 10 μm) and therefore were uniform in quality.

Example 18

Perhydropolysilazane synthesized in Reference Example 1 was dissolved in decahydronaphthalene to prepare a solution containing 20 wt. % of perhydropolysilazane. 20 mg of acetic acid and 300 mg of tributyl amine were gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were placed in a thermo-hygrostat maintained at a temperature of 95° C. and a relative humidity of 80% and subjected to moistening treatment for one hour. The thus-obtained films were measured for an acid corrosion rate (etching rate) to evaluate a denseness thereof. The measurement revealed that the etching rate of each of the films was not less than 1,400 Å/min. Further, the obtained films were observed by a microscope (×120). The observation revealed that the films had no irregularities and therefore were uniform in quality.

Example 19

Perhydropolysilazane synthesized in Reference Example 1 was dissolved in decahydronaphthalene to prepare a solution containing 20 wt. % of perhydropolysilazane. 20 mg of acetic acid and 300 mg of tributyl amine were gradually added to 10 g of the solution at room temperature while stirring. The thus-obtained solution was spin-coated onto surfaces of a silicon plate and a glass plate at 3000 rpm for 20 seconds in an atmosphere (25° C., 50% RH). These plates were heated on a hot plate maintained at 250° C. for 3 minutes in an atmosphere (25° C., 50% RH). At this time, no smoke was generated and the weight of each of the films on the silicon and glass plates after heating was 104% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 850 Å/min. Further, the obtained films were observed by a microscope (×120). The observation revealed that the films had no irregularities and no spherical pores (1 to 10 μm) and therefore were uniform in quality.

Example 20

Perhydropolysilazane synthesized in Reference Example 1 was dissolved in decahydronaphthalene to prepare a solution containing 20 wt. % of perhydropolysilazane. The thus-obtained solution was spin-coated onto surfaces of a silicon plate and a glass plate at 3000 rpm for 20 seconds in an atmosphere (25° C., 50% RH). Next, 50 g of triethyl amine and 950 g of pure water were charged in a 2000 ml beaker and heated while stirring to 50° C. by a mantled heater. The silicon or glass plate on which perhydropolysilazane was coated, was immersed in the thus-prepared solution for 15 minutes. The thus-obtained films were measured for an acid corrosion rate (etching rate) to evaluate a denseness thereof. The measurement revealed that the etching rate of each of the films was 2,300 Å/min. Further, the obtained films were observed by a microscope (×120). The observation revealed that the films had no irregularities and therefore were uniform in quality.

Example 21

Perhydropolysilazane synthesized in Reference Example 1 was dissolved in decahydronaphthalene to prepare a solution containing 20 wt. % of perhydropolysilazane. The thus-obtained solution was spin-coated onto surfaces of a silicon plate and a glass plate at 3000 rpm for 20 seconds in an atmosphere (25° C., 50% RH). Next, 50 g of triethyl amine and 950 g of pure water were charged in a 2000 ml beaker at room temperature. These silicon and glass plates on which the above-prepared perhydropolysilazane was coated, were immersed in the thus-obtained solution for 5seconds. These plates were heated on a hot plate maintained at 250° C. for 3 minutes in an atmosphere (25° C., 50% RH). At this time, no smoke was generated and the weight of each of the films on the silicon and glass plates after heating was 106% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 1,000 Å/min. Further, the obtained films were observed by a microscope (×120). The observation revealed that the films had no irregularities and no spherical pores (1 to 10 μm) and therefore were uniform in quality.

Example 22

Perhydropolysilazane synthesized in Reference Example 1 was dissolved in decahydronaphthalene to prepare a solution containing 20 wt. % of perhydropolysilazane. The thus-prepared solution was spin-coated onto surfaces of a silicon plate and a glass plate at 3000 rpm for 20 seconds in an atmosphere (25° C., 50% RH). Next, 50 g of n-butyl amine and 950 g of pure water were charged in a 2000 ml beaker and stirred at room temperature (20° C.). These silicon and glass plates on which the above-prepared perhydropolysilazane was coated, were immersed in the thus-obtained aqueous solution for one hour. The thus-obtained films were measured for an acid corrosion rate (etching rate) to evaluate a denseness thereof. The measurement revealed that the etching rate of each of the films was 2,800 Å/min. Further, the obtained films were observed by a microscope (×120). The observation revealed that the films had no irregularities and therefore were uniform in quality.

Example 23

Perhydropolysilazane synthesized in Reference Example 1 was dissolved in decahydronaphthalene to prepare a solution containing 20 wt. % of perhydropolysilazane. The thus-prepared solution was spin-coated onto surfaces of a silicon plate and a glass plate at 3000 rpm for 20 seconds in an atmosphere (25° C., 50% RH). Next, 5 g of triethyl amine and 95 g of pure water were charged in a 2000 ml beaker and heated to 50° C. by a mantled heater while stirring. The silicon and glass plates on which the above-prepared perhydropolysilazane was coated, were suspended in a gas phase portion in the beaker for 30 minutes. The thus-obtained films were measured for an acid corrosion rate (etching rate) to evaluate a denseness thereof. The measurement revealed that the etching rate of each of the films was 1,900 Å/min. Further, the obtained films were observed by a microscope (×120). The observation revealed that the films had no irregularities and therefore were uniform in quality.

Example 24

Perhydropolysilazane synthesized in Reference Example 1 was dissolved in decahydronaphthalene to prepare a solution containing 20 wt. % of perhydropolysilazane. The thus-prepared solution was spin-coated onto surfaces of a silicon plate and a glass plate at 3000 rpm for 20 seconds in an atmosphere (25° C., 50% RH). Next, 5 g of triethyl amine and 95 g of pure water were charged in a 2000 ml beaker at room temperature. The silicon and glass plates on which the above-prepared perhydropolysilazane was coated, were suspended in a gas phase portion in the beaker for 10 seconds. These plates were heated on a hot plate maintained at 250° C. for 3 minutes in an atmosphere (25° C., 50% RH). At this time, no smoke was generated and the weight of each of the films on theses plates after heating was 101% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 800 Å/min. Further, the obtained films were observed by a microscope (×120). The observation revealed that the films had no irregularities and no spherical pores (1 to 10 μm) and therefore were uniform in quality.

Example 25

Perhydropolysilazane synthesized in Reference Example 1 was dissolved in decahydronaphthalene to prepare a solution containing 20 wt. % of perhydropolysilazane. The thus-prepared solution was spin-coated onto surfaces of a silicon plate and a glass plate at 3000 rpm for 20 seconds in an atmosphere (25° C., 50% RH). Next, 1,000 g of 30 wt. % hydrogen peroxide aqueous solution was charged in a 2000 ml beaker and heated to 50° C. by a mantled heater while stirring. The silicon and glass plates on which the above-prepared perhydropolysilazane was coated, were immersed in the hydrogen peroxide aqueous solution for 30 minutes. The thus-obtained films were measured for an acid corrosion rate (etching rate) to evaluate a denseness thereof. The measurement revealed that the etching rate of each of the films was 1,700 Å/min. Further, the obtained films were observed by a microscope (×120). The observation revealed that the films had no irregularities and no spherical pores (1 to 10 μm) and therefore were uniform in quality.

Example 26

Perhydropolysilazane synthesized in Reference Example 1 was dissolved in decahydronaphthalene to prepare a solution containing 20 wt. % of perhydropolysilazane. The thus-prepared solution was spin-coated onto surfaces of a silicon plate and a glass plate at 3000 rpm for 20 seconds in an atmosphere (25° C., 50% RH). Next, 1,000 g of 30 wt. % hydrogen peroxide aqueous solution was charged in a 2000 ml beaker at room temperature. The silicon and glass plates on which the above-prepared perhydropolysilazane was coated, were suspended in a gas phase portion in the beaker for 10 seconds. These plates were heated on a hot plate maintained at 250° C. for 3 minutes in an atmosphere (25° C., 50% RH). At this time, no smoke was generated and the weight of each of the films on these plates after heating was 105% of that before heating. Further, these plates were calcined at 450° C. for one hour in an atmosphere. The thus-obtained films were measured for an acid corrosion rate (etching rate) to evaluate a denseness thereof. The measurement revealed that the etching rate of each of the films was 700 Å/min. Further, the obtained films were observed by a microscope (×120). The observation revealed that the films had no irregularities and no spherical pores (1 to 10 μm) and therefore were uniform in quality.

Example 27

Perhydropblysilazane synthesized in Reference Example 1 was dissolved in m-xylene to prepare a 12 wt. % polysilazane solution. Acetic acid was gradually added to the solution at room temperature while stirring to prepare a solution containing 5 wt. % of acetic acid. The solution was applied onto one surface of a polyethylene terephthalate (PET) film substrate having a thickness of 75 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to obtain a dry polysilazane film on the film substrate (residence time: 5 minutes).

The polysilazane-coated film substrate having passed through the drying zone was further transported through a moistening furnace maintained at 95° C. and a relative humidity of 80% and having an interior transportation distance of 60 m at the same transportation rate as described above, to expose the polysilazane film to a steam-containing atmosphere for 30 minutes.

Example 28

Perhydropolysilazane synthesized in Reference Example 1 was dissolved in m-xylene to prepare a 12 wt. % polysilazane solution. Propionic acid was gradually added to the solution at room temperature while stirring to prepare a solution containing 5 wt. % of propionic acid. The solution was applied onto one surface of a polyether sulfone (PES) film substrate having a thickness of 75 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to form a dry polysilazane film on the film substrate (residence time: 5 minutes).

The polysilazane-coated film substrate having passed through the drying zone was further transported through a moistening furnace maintained at 95° C. and a relative humidity of 80% and having an interior transportation distance of 60 m, at the same transportation rate as described above, to expose the polysilazane film to a steam-containing atmosphere for 30 minutes.

Example 29

Perhydropolysilazane synthesized in Reference Example 1 was dissolved in m-xylene to prepare a 12 wt. % polysilazane solution. Stearic acid was gradually added to the solution at room temperature while stirring to prepare a solution containing 5 wt. % of stearic acid. The solution was applied onto one surface of a polyarylate (PAR) film substrate having a thickness of 75 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to form a dry polysilazane film on the film substrate (residence time: 5 minutes).

The polysilazane-coated film substrate having passed through the drying zone was further transported through a moistening furnace maintained at 95° C. and a relative humidity of 80% and having an interior transportation distance of 60 m, at the same transportation rate as described above, to expose the polysilazane film to a steam-containing atmosphere for 30 minutes.

Example 30

Perhydropolysilazane synthesized in Reference Example 1 was dissolved in m-xylene to prepare a 12 wt. % polysilazane solution. Trimethyl amine was gradually added to the solution at room temperature while stirring to prepare a solution containing 25 wt. % of trimethyl amine. The solution was applied onto one surface of a triacetate (TAC) film substrate having a thickness of 80 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to form a dry polysilazane film on the film substrate (residence time: 5 minutes).

The polysilazane-coated film substrate having passed through the drying zone was rolled up. Thereafter, while being unrolled, the polysilazane-coated film substrate was again transported through the drying zone at a rate of 1 m/min, to expose the polysilazane film to a steam-containing atmosphere for 10 minutes.

Example 31

Perhydropolysilazane synthesized in Reference Example 1 was dissolved in m-xylene to prepare a 12 wt. % polysilazane solution. Tripentyl amine was gradually added to the solution at room temperature while stirring to prepare a solution containing 25 wt. % of tripentyl amine. The solution was applied onto one surface of a polyethylene terephthalate (PET) film substrate having a thickness of 75 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to form a dry polysilazane film on the film substrate (residence time: 5 minutes).

The polysilazane-coated film substrate having passed through the drying zone was rolled up. Thereafter, while being unrolled, the polysilazane-coated film substrate was again transported through the drying zone at a rate of 1 m/min, to expose the polysilazane film to a steam-containing atmosphere for 10 minutes.

Example 32

Perhydropolysilazane synthesized in Reference Example 1 was dissolved in m-xylene to prepare a 12 wt. % polysilazane solution. Normal-octyl amine was gradually added to the solution at room temperature while stirring to prepare a solution containing 25 wt. % of n-octyl amine. The solution was applied onto one surface of a polyether sulfone (PES) film substrate having a thickness of 75 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to form a dry polysilazane film on the film substrate (residence time: 5 minutes).

The polysilazane-coated film substrate having passed through the drying zone was rolled up. Thereafter, while being unrolled, the polysilazane-coated film substrate was again transported through the drying zone at a rate of 1 m/min, to expose the polysilazane film to a steam-containing atmosphere for 10 minutes.

Example 33

Perhydropolysilazane synthesized in Reference Example 1 was dissolved in m-xylene to prepare a 12 wt. % polysilazane solution. Propionic acid and di-n-butyl amine were gradually added to the solution at room temperature while stirring to prepare a solution containing 1 wt. % of propionic acid and 10 wt. % of di-n-butyl amine. The solution was applied onto one surface of a polyether sulfone (PES) film substrate having a thickness of 75 μm, a width of 60 cm and an overall length of 300 m and being transported at a rate of 2 m/min, according to a gravure coating method (reverse-roll coating method: roll #80).

Successively, the film substrate coated was passed through a drying zone (maintained at 80° C. and a relative humidity of 70% and having an interior transportation distance of 10 m) into which steam was introduced, at the same transportation rate as described above, to form a dry polysilazane film on the film substrate (residence time: 5 minutes). The polysilazane-coated film substrate having passed through the drying zone was rolled up. Thereafter, while being unrolled, the polysilazane-coated film substrate was again transported through the drying zone at a rate of 1 m/min, to expose the polysilazane film to a steam-containing atmosphere for 10 minutes.

Example 34

Perhydropolysilazane synthesized in Reference Example 1 was dissolved in m-xylene to prepare a 12 wt. % polysilazane solution. The solution was applied onto one surface of a polyethylene terephthalate (PET) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 25° C. and a relative humidity of 60% and having an interior transportation distance of 5 m) in which zone a vapor of hydrogen peroxide evaporated from a 30 wt. % hydrogen peroxide aqueous solution was present, at the same transportation rate as described above, to dry the polysilazane film on the film substrate and expose the film to the vapor of hydrogen peroxide (residence time: 1 minute)

The polysilazane-coated film substrate having passed through the drying zone was further transported through a moistening furnace maintained at 95° C. and a relative humidity of 8.0% and having an interior transportation distance of 25 m, at the same transportation rate as described above, to expose the polysilazane film to a steam-containing atmosphere for 5 minutes.

Example 35

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of hydrogen chloride evaporated from a 10 wt. % hydrogen chloride aqueous solution was present, at the same transportation rate as described above, to dry the polysilazane film on the film substrate and expose the film to the vapor of hydrogen chloride (residence time: 1 minute).

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 36

Perhydropolysilazane synthesized in Reference Example 1 was dissolved in m-xylene to prepare a 12 wt. % polysilazane solution. The solution was applied onto one surface of a polyarylate (PAR) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of acetic acid evaporated from a 10 wt. % acetic acid aqueous solution was present, at the same transportation rate as described above, to dry the polysilazane film on the film substrate and expose the film to the vapor of acetic acid (residence time: 1 minute).

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 37

Perhydropolysilazane synthesized in Reference Example 1 was dissolved in m-xylene to prepare a 12 wt. % polysilazane solution. The solution was applied onto one surface of a polyethersulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of methyl amine evaporated from liquefied methyl amine was present, at the same transportation rate as described above, to dry the polysilazane film on the film substrate and expose the film to the vapor of methyl amine (residence time: 1 minute).

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 38

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 39

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a distilled water-containing bath maintained at 90° C. and having an interior transportation distance of 25 m, at the same transportation rate as described above, to immerse the polysilazane film in distilled water for 5 minutes.

Example 40

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a 1 wt. % sulfuric acid aqueous solution-containing bath maintained at 90° C. and having an interior transportation distance of 25 m, at the same transportation rate as described above, to immerse the polysilazane film in 1 wt. % sulfuric acid aqueous solution for 5 minutes.

Example 41

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a 1 wt. % phosphoric acid aqueous solution-containing bath maintained at 90° C. and having an interior transportation distance of 25 m, at the same transportation rate as described above, to immerse the polysilazane film in 1 wt. % phosphoric acid aqueous solution for 5 minutes.

Example 42

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a 0.1 wt. % sodium hydroxide aqueous solution-containing bath maintained at 90° C. and having an interior transportation distance of 25 m, at the same transportation rate as described above, to immerse the polysilazane film in 0.1 wt. % sodium hydroxide aqueous solution for 5 minutes.

Example 43

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a 0.1 wt. % ammonium chloride aqueous solution-containing bath maintained at 90° C. and having an interior transportation distance of 25 m, at the same transportation rate as described above, to immerse the polysilazane film in 0.1 wt. % ammonium chloride aqueous solution for 5 minutes.

Example 44

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

Permeable separator sheet (non-woven fabric or side tape) was placed on the polysilazane-coated film substrate having passed through the drying zone so as to cover a whole surface or peripheral surface portions thereof and then the polysilazane-coated film substrate was rolled up together with the permeable separator sheet. Thereafter, the polysilazane-coated film substrate rolled was allowed to stand in an atmosphere having a temperature of 25° C. and a relative humidity of 50% for 24 hours.

Example 45

Perhydropolysilazane synthesized in Reference Example 1 was dissolved in m-xylene to prepare a 12 wt. % polysilazane solution. The solution was applied onto one surface of a triacetate (TAC) film substrate having a thickness of 80 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of tributyl amine evaporated from a 5 wt. % triethyl amine aqueous solution was present, at the same transportation rate as described above, to dry the polysilazane film on the film substrate and expose the film to the vapor of tributyl amine (residence time: 1 minute).

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 46

Perhydropolysilazane synthesized in Reference Example 1 was dissolved in m-xylene to prepare a 12 wt. % polysilazane solution. The solution was applied onto one surface of a polyethylene terephthalate (PET) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 25° C. and a relative humidity of 60% and having an interior transportation distance of 5 m) in which zone a mixed vapor of acetic acid and triethyl amine evaporated from an aqueous solution containing 5 wt. % acetic acid and 5 wt. % triethyl amine was present, at the same transportation rate as described above, to dry the polysilazane film on the film substrate and expose the film to the mixed vapor of acetic acid and triethyl amine (residence time: 1 minute).

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 47

Perhydropolysilazane synthesized in Reference Example 1 was dissolved in m-xylene to prepare a 12 wt. % polysilazane solution. Palladium propionate was gradually added to the solution at room temperature while stirring to prepare a solution containing 1 wt. % of palladium propionate. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

Successively, the film substrate coated was passed through a drying zone (maintained at 80° C. and a relative humidity of 40% and having an interior transportation distance of 5 m) in which zone a vapor of triethyl amine evaporated from a 3 wt. % triethyl amine aqueous solution was present, at the same transportation rate as described above, to dry the polysilazane film on the film substrate and expose the film to the vapor of triethyl amine (residence time: 1 minute).

The polysilazane-coated film substrate having passed through the drying zone was further transported through a moistening furnace maintained at 95° C. and a relative humidity of 80% and having an interior transportation distance of 15 m, at the same transportation rate as described above, to expose the polysilazane film to a steam-containing atmosphere for 3 minutes.

Example 48

Perhydropolysilazane synthesized in Reference Example 1 was dissolved in m-xylene to prepare a 12 wt. % polysilazane solution. The solution was applied onto one surface of a polyarylate (PAR) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 30 wt. % hydrogen peroxide aqueous solution-containing bath maintained at 50° C. and having an interior transportation distance of 150 m, at the same transportation rate as described above, to immerse the polysilazane film in 30 wt. % hydrogen peroxide aqueous solution for 15 minutes.

Example 49

Perhydropolysilazane synthesized in Reference Example 1 was dissolved in m-xylene to prepare a 12 wt. % polysilazane solution. The solution was applied onto one surface of a triacetate (TAC) film substrate having a thickness of 80 μm, a width of 60 cm and an overall length of 300 m and being transported at a rate of 10 m/min, according to a gravure coating method (reverse-roll coating method: roll #80).

Successively, the film substrate coated was passed through a solvent drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 5 wt. % acetic acid aqueous solution-containing bath maintained at 50° C. and having an interior transportation distance of 150 m, at the same transportation rate as described above, to immerse the polysilazane film in 5 wt. % acetic acid aqueous solution for 15 minutes.

Example 50

Perhydropolysilazane synthesized in Reference Example 1 was dissolved in m-xylene to prepare a 12 wt. % polysilazane solution. The solution was applied onto one surface of a polyethylene terephthalate (PET) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 5 wt. % propionic acid aqueous solution-containing bath maintained at 50° C. and having an interior transportation distance of 150 m, at the same transportation rate as described above, to immerse the polysilazane film in 5 wt. % propionic acid aqueous solution for 15 minutes.

Example 51

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 5 wt. % caproic acid aqueous solution-containing bath maintained at 50° C. and having an interior transportation distance of 150 m, at the same transportation rate as described above, to immerse the polysilazane film in 5 wt. % caproic acid aqueous solution for 15 minutes.

Example 52

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 5 wt. % trimethyl amine aqueous solution-containing bath maintained at 25° C. and having an interior transportation distance of 150 m, at the same transportation rate as described above, to immerse the polysilazane film in 5 wt. % trimethyl amine aqueous solution for 15 minutes.

Example 53

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 3 wt. % n-butyl amine aqueous solution-containing bath maintained at 25° C. and having an interior transportation distance of 50 m, at the same transportation rate as described above, to immerse the polysilazane film in 3 wt. % n-butyl amine aqueous solution for 5 minutes.

Example 54

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 5 wt. % octyl amine aqueous solution-containing bath maintained at 50° C. and having an interior transportation distance of 150 m, at the same transportation rate as described above, to immerse the polysilazane film in 5 wt. % octyl amine aqueous solution for 15 minutes.

Example 55

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 10 m/min, according to a gravure coating method (reverse-roll coating method: roll #80).

Successively, the film substrate coated was passed through a drying zone (Hot air temperature: 80° C., Interior transportation distance: 10 m) at the same transportation rate as described above, to dry the polysilazane film on the film substrate (residence time: 1 minute).

The polysilazane-coated film substrate having passed through the drying zone was further transported through a 1 wt. % acetic acid/3 wt. % n-pentyl amine aqueous solution-containing bath maintained at 50° C. and having an interior transportation distance of 150 m, at the same transportation rate as described above, to immerse the polysilazane film in 1 wt. % acetic acid/3 wt. % n-pentyl amine aqueous solution for 15 minutes.

Example 56

Perhydropolysilazane synthesized in Reference Example 1 was dissolved in m-xylene to prepare a 12 wt. % polysilazane solution. The solution was applied onto one surface of a polyether sulfone (PES) film substrate having a thickness of 75 μm, a width of 60 cm and an overall length of 300 m and being transported at a rate of 5 m/min, according to a gravure coating method (reverse-roll coating method: roll #80).

In this Example, there was adopted a method in which a vapor of an amine compound evaporated from an amine compound-containing aqueous solution using a separate steam generator, steam and a nitrogen gas were transported in the form of a gaseous mixture to the drying zone and sprayed through a nozzle thereinto.

Specifically, a nitrogen gas was blown into two containers respectively charged with a 5 wt. % methylene chloride amine aqueous solution and with distilled water, to make bubbles in these liquids, thereby obtaining a vapor of methyl amine and steam. At this time, the nitrogen gas was introduced into the respective containers at a such a flow rate that an internal pressure of each container was maintained at about $1.5 \times 10^5$ Pa (1.5 kgf/cm$^2$). The nitrogen gas containing vapor of methyl amine and steam were taken out of gas phases in the respective containers and then fed into the drying zone through pipe lines and sprayed through nozzles thereinto. In this case, the pipe lines were branched into four pipe sublines in the mid thereof. The four pipe sublines branched were respectively coupled to four nozzles which were located within the drying zone at a position about 3 m apart from an entrance of the drying zone and arranged in parallel spaced by about 40 cm apart from each other in the direction perpendicular to the transportation of the coated film substrate.

Next, the film substrate coated was transported through the afore-mentioned drying zone (having an interior transportation distance of 5 m) at the same transportation rate as described above. In the drying zone, the film on the film substrate transported therethrough was partially dried in an initial region up to 3 m from the entrance thereof (which region was maintained at a temperature of 80° C. and a relative humidity of 40% and in which region the residence time of the film was 0.6 minute). In the remaining 2 m region of the drying zone (which was maintained at room temperature and in which the residence time of the film was 0.4 minute), the vapor of methylene amine and steam together with nitrogen gas was sprayed over the film through the four nozzles disposed at a height of 20 mm above a surface of the film. The average concentration of the vapor of methyl amine in the drying zone, was approximately 1 volume % and the total residence time of the film in the drying zone was 1 minute.

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 57

Perhydropolysilazane synthesized in Reference Example 1 was dissolved in m-xylene to prepare a 12 wt. % polysilazane solution. The solution was applied onto one surface of a polyethylene terephthalate (PET) film substrate having a thickness of 75 μm, a width of 60 cm and an overall length of 300 m and being transported at a rate of 5 m/min, according to a gravure coating method (reverse-roll coating method: roll #80).

In this Example, there was adopted the same method as described in Example 40, in which a vapor of an amine compound evaporated from an amine compound-containing aqueous solution using a separate steam generator, was transported to the drying zone and sprayed through nozzles thereinto.

Specifically, a nitrogen gas was blown into a container charged with a 3 wt. % triethyl amine aqueous solution to make bubbles in the liquid. At this time, the nitrogen gas was introduced into the container to cause the bubbling of the liquid at a such a flow rate that an internal pressure of the container was maintained at about $1.5 \times 10^5$ Pa (1.5 kgf/cm$^2$). The vapor of triethyl amine and steam carried on the nitrogen gas were taken out of a gas phase in the container and then fed into the drying zone through pipe lines and sprayed through nozzles thereinto. In this case, the pipe lines were branched into four pipe sublines in the mid thereof. The four pipe sublines branched were coupled respectively to four nozzles which were located within the drying zone at a position about 3 m apart from an entrance of the drying zone and arranged in parallel spaced by about 40 cm apart from each other in the direction perpendicular to the transportation of the coated film substrate.

Next, the coated film substrate prepared above was transported through the drying zone (having an interior transportation distance of 5 m) at the same transportation rate as described above. In the drying zone, the polysilazane film on the film substrate transported therethrough was partially dried in an initial region up to 3 m from the entrance thereof (which was maintained at room temperature and in which the residence time of the film was 0.6 minute). In the remaining 2 m region of the drying zone (which was maintained at room temperature and in which the residence time of the film was 0.4 minute), the vapor of triethyl amine and steam together with nitrogen gas was sprayed over the film through the four nozzles disposed at a height of 20 mm above a surface of the film. The average concentration of the vapor of triethyl amine in the drying zone, was approximately 1 volume % and the total residence time of the film in the drying zone was 1 minute.

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 58

Perhydropolysilazane synthesized in Reference Example 1 was dissolved in m-xylene to prepare a 12 wt. % polysilazane solution. The solution was applied onto one surface of a triacetate (TAC) film substrate having a thickness of 80 $\mu$m, a width of 60 cm and an overall length of 300 m and being transported at a rate of 5 m/min, according to a gravure coating method (reverse-roll coating method: roll #80).

In this Example, there was adopted the same method as described in Example 40, in which a vapor of an amine compound evaporated from an amine compound-containing aqueous solution using a separate steam generator, was transported to the drying zone and sprayed through nozzles thereinto.

Specifically, a nitrogen gas was blown into a container charged with a 5 wt. % tributyl amine aqueous solution to make bubbles in the liquid. At this time, the nitrogen gas was introduced into the container at a such a flow rate that an internal pressure of the container was maintained at about $1.5 \times 10^5$ Pa (1.5 kgf/cm$^2$). The vapor of tributyl amine and steam carried by the nitrogen gas were taken out of a gas phase in the container and then fed into the drying zone through a pipe line and sprayed through nozzles thereinto. In this case, the pipe line was branched into four pipe sublines in the mid thereof. The four pipe sublines branched were coupled respectively to four nozzles which were located within the drying zone at a position about 3 m apart from an entrance of the drying zone and arranged in parallel spaced by about 40 cm apart from each other in the direction perpendicular to the transportation of the polysilazane-coated film substrate.

Next, the polysilazane-coated film substrate prepared above was transported through the afore-mentioned drying zone (having an interior transportation distance of 5 m) at the same transportation rate as described above. In the drying zone, the polysilazane film on the film substrate transported therethrough was partially dried in an initial region up to 3 m from the entrance thereof (which was maintained at a temperature of 80° C. and a relative humidity of 40% and in which the residence time of the film was 0.6 minute). In the remaining 2 m region of the drying zone (which was maintained at room temperature and in which the residence time of the film was 0.4 minute), the vapor of tributyl amine and steam together with nitrogen gas were sprayed over the film through the four nozzles disposed at a height of 20 mm above a surface of the film. The average concentration of the vapor of tributyl amine in the drying zone, was approximately 1 volume % and the total residence time of the film in the drying zone was 1 minute.

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Example 59

Perhydropolysilazane synthesized in Reference Example 1 was dissolved in m-xylene to prepare a 12 wt. % polysilazane solution. The solution was applied onto one surface of a polyethylene terephthalate (PET) film substrate having a thickness of 75 $\mu$m, a width of 60 cm and an overall length of 300 m and being transported at a rate of 5 m/min, according to a gravure coating method (reverse-roll coating method: roll #80).

In this Example, there was adopted the same method as described in Example 40, in which a vapor of an amine compound evaporated from an amine compound-containing aqueous solution using a separate steam generator, was transported to the drying zone and sprayed through nozzles thereinto.

Specifically, a nitrogen gas was independently blown into two containers respectively charged with triethyl amine as a single substance and with distilled water to make bubbles in the latter liquids. At this time, the nitrogen gas was introduced into the containers at such a flow rate that an internal pressure of each container was maintained at about $1.5 \times 10^5$ Pa (1.5 kgf/cm$^2$). The vapor of triethyl amine and steam each carried by the nitrogen gas were taken out of a gas phase in each container and then introduced into a pipe line so as to be fed into the drying zone and sprayed through nozzles thereinto. In this case, the pipe line was branched into four pipe sublines in the mid thereof. The four pipe sublines branched were coupled respectively to four nozzles which were located within the drying zone at a position about 3 m apart from an entrance of the drying zone and arranged in parallel spaced by about 40 cm apart from each other in the direction perpendicular to the transportation of the polysilazane-coated film substrate.

Next, the polysilazane-coated film substrate prepared above was transported through the afore-mentioned drying zone (having an interior transportation distance of 5 m) at the same transportation rate as described above. In the drying zone, the polysilazane film on the film substrate transported therethrough was partially dried in an initial region up to 3 m from the entrance thereof (which was maintained at room temperature and in which the residence time of the film was 0.6 minute). In the remaining 2 m region of the drying zone (which was maintained at room temperature and in which the residence time of the film was 0.4 minute), the vapor of triethyl amine and steam together with nitrogen gas were sprayed over the film through the four nozzles disposed at a height of 20 mm above a surface of the film. The average concentration of the vapor of triethyl amine in the drying zone, was approximately 1 volume % and the total residence time of the film in the drying zone was 1 minute.

The polysilazane-coated film substrate having passed through the drying zone was further transported through a moistening furnace maintained at 95° C. and a relative humidity of 80% and having an interior transportation distance of 25 m, at the same transportation rate as described above, to expose the polysilazane film to a steam-containing atmosphere for 5 minutes.

Evaluation of Film Properties

The ceramic transformation of substantially an entire portion of the respective films obtained in Examples 27 to 59 above was determined by the dissipation of peaks of Si—H oscillation (N—H oscillation) and the emergence of peaks of Si—O oscillation when measured according to an IR spectroscopic analysis. Further, the thicknesses of the respective ceramic films were calculated from coherent peaks of visible spectrum according to a spectroscopic analysis. As a result, it was confirmed that all the thicknesses of the ceramic films were 0.6 μm.

These ceramic films were evaluated with respect to the following properties. Also, the properties of the plastic film substrates themselves used were evaluated as a reference in the same manner except adhesion properties. The results are shown in Table 1.

(1) Oxygen permeability (unit: cc/m²/24 hours/atm):
  Measured at 25° C. and 65% RH by a measuring device manufactured by Mocon Corp.
(2) Steam permeability (unit: g/m²/24 hours):
  Measured at 40° C. by a measuring device manufactured by Mocon Corp.
(3) Light transmittance:
  Measured in terms of average transmittance of visible lights by a hazemeter.
(4) Scuff resistance:
  The respective film samples were tested by bringing them into rotational contact with steel wool #000 at a load of 250 g for 100 revolution cycles (at 60 rpm). The samples tested were visually observed to count the number of scuff marks or scratches formed thereon. The results were evaluated by classifying into five ranks: A: No scuff marks, B: not more than two scuff marks, C: 3 to 5 scuff marks, D: 6 to 10 scuff marks, and E: not less than 11 scuff marks.
(5) Adhesion properties:

Evaluated by a cross-cut tape peel test.

TABLE 1

| Example No. | Oxygen permeability | Steam permeability | Light transmittance | Scuff resistance | Adhesion Adhesion properties |
|---|---|---|---|---|---|
| 27 | 1.6 | 2.0 | 91 | B | 100/100 |
| 28 | 2.4 | 2.8 | 93 | B | 100/100 |
| 29 | 2.4 | 2.8 | 93 | B | 100/100 |
| 30 | 2.0 | 20.0 | 95 | B | 100/100 |
| 31 | 0.8 | 1.2 | 91 | B | 100/100 |
| 32 | 2.4 | 2.8 | 93 | B | 100/100 |
| 33 | 1.2 | 1.8 | 93 | B | 100/100 |
| 34 | 1.6 | 2.0 | 91 | B | 100/100 |
| 35 | 2.4 | 2.8 | 93 | B | 100/100 |
| 36 | 2.4 | 2.8 | 93 | B | 100/100 |
| 37 | 2.4 | 2.8 | 93 | B | 100/100 |
| 38 | 1.2 | 1.8 | 93 | A–B | 100/100 |
| 39 | 1.8 | 2.3 | 93 | A–B | 100/100 |
| 40 | 1.8 | 2.3 | 93 | A–B | 100/100 |
| 41 | 1.8 | 2.3 | 93 | A–B | 100/100 |
| 42 | 1.8 | 2.3 | 93 | A–B | 100/100 |
| 43 | 1.8 | 2.3 | 93 | B | 100/100 |
| 44 | 1.2 | 1.8 | 93 | B | 100/100 |
| 45 | 1.5 | 15.0 | 95 | B | 100/100 |
| 46 | 1.2 | 1.6 | 91 | B | 100/100 |
| 47 | 1.8 | 2.3 | 93 | A–B | 100/100 |
| 48 | 2.4 | 2.8 | 93 | A–B | 100/100 |
| 49 | 2.0 | 20.0 | 95 | A–B | 100/100 |
| 50 | 1.6 | 2.0 | 91 | A–B | 100/100 |
| 51 | 2.4 | 2.8 | 93 | A–B | 100/100 |
| 52 | 2.4 | 2.8 | 93 | A–B | 100/100 |
| 53 | 2.4 | 2.8 | 93 | A–B | 100/100 |
| 54 | 2.4 | 2.8 | 93 | A–B | 100/100 |
| 55 | 2.4 | 2.8 | 93 | A–B | 100/100 |
| 56 | 0.6 | 0.9 | 93 | B | 100/100 |
| 57 | 0.5 | 0.8 | 91 | B | 100/100 |
| 58 | 1.0 | 5.0 | 95 | B | 100/100 |
| 59 | 0.5 | 0.8 | 91 | B | 100/100 |
| PET 75 μm | 25 | 12 | 88 | E | |
| PES 75 μm | 350 | 40 | 87 | E | |
| PAR 75 μm | 400 | 50 | 89 | E | |
| TAC 80 μm | 180 | 460 | 92 | E | |

By using a composition containing the silazane-based polymer according to the present invention, $SiO_2$-based ceramic material can be produced smoothly at a low temperature. In this case, the ceramic-transformation can be rapidly carried out at a temperature as low as not more than 100° C., especially not more than 50° C. Accordingly, in accordance with the present invention, the ceramic-transformation can be completed before low molecular weight fractions in the polymer are evaporated. Accordingly, the ceramic material produced according to the present invention has a smooth surface. In addition, since low-molecular fractions in the polymer are prevented from being evaporated, there arise no problems such as loss of the polymer or contamination of apparatuses by the evaporated polymer.

As described above, the transformation of the silazane-based polymer into the ceramic material can be rapidly carried out at a low temperature, so that the present invention can be advantageously applied to a method of forming a ceramic film on substrates or elements used in the field of electronic products, or a method of forming a ceramic film on surfaces of plastic films, or the like.

What is claimed is:

1. A process for producing a $SiO_2$-based ceramic material, comprising:
  bringing a silazane-based polymer, said polymer containing Si—N, Si—H and N—H bonds, into contact with a vapor of at least one ceramic-transformation promoting agent selected from the group consisting of an amine compound, an acid compound and a peroxide, and with steam, separately or simultaneously, at a temperature of 20–500° C., to eliminate said bonds and to simultaneously form new Si—O bonds, thereby transforming said polymer into the ceramic material.

2. A $SiO_2$-based ceramamic material produced by a process according to claim 1.

3. A process for producing a $SiO_2$-based ceramic material according to claim 1 wherein said temperature is 30–100° C.

4. A process for producing a SiO$_2$-based ceramic film on a surface of a solid body, comprising:

forming, on the surface of said solid body, a film comprising a silazane-based polymer containing Si—N, N—H and Si—H bonds; and bringing said film into contact with a vapor of at least one ceramic-transformation promoting agent selected from the group consisting of an amine compound, an acid compound and a peroxide, and steam, separately or simultaneously, at a temperature of 20–500° C., to eliminate said bonds and to simultaneously for new Si—O bonds, thereby transforming said film into the ceramic film.

5. A process according to claim 4, further comprising bringing said ceramic film into contact with steam, water, an aqueous acid solution or an aqueous alkaline solution.

6. A solid product comprising the ceramic film produced by a method according to claim 4, on the surface of said solid body.

7. A process for forming a SiO$_2$-based ceramic film on a solid body, comprising:

(a) applying a coating material comprising a silazane-based polymer on a surface of the solid body to form a film of said coating material thereon, said polymer containing Si—N, Si—H and N—H bonds;

(b) drying said film of the coating material to form a polymer film on the solid body; and (c) bringing said polymer film on the solid body into contact with a vapor of at least one ceramic-transformation promoting agent selected from the group consisting of an amine compound, an acid compound and a peroxide, and with steam, separately or simultaneously, at a temperature of 20–500° C., to eliminate said bonds and to simultaneously form new Si–O bonds, thereby transforming the polymer film into the ceramic film.

8. A process according to claim 7, wherein by carrying out the drying of the film of the coating material in the presence of the ceramic-transformation promoting agent and steam, the transformation into the ceramic film is conducted simultaneously with the drying.

9. A solid product having the ceramic film, which is produced by a method according to claim 7, on the surface of the solid body.

* * * * *

UNITED STATES PATENT AND TRADEMARK OFFICE
CERTIFICATE OF CORRECTION

PATENT NO. : 5,922,411
DATED : July 13, 1999
INVENTOR(S) : SHIMIZU et al

It is certified that error appears in the above-identified patent and that said Letters Patent is hereby corrected as shown below:

Col. 1, line 17, delete "there can be";
    line 18, delete "obtained";
    line 19, after "resistance" insert --can be obtained--;
    line 21, delete "As is known, the silazane" and insert --Silazane--;
    line 26, delete "there has been adopted" and after "method" insert --has been adopted--;
    line 30, after "However," insert --in--;
    line 38, after "have" insert --has--;
    line 47, delete "denseness" insert --density--;
    line 49, delete "so as not";
    line 59, delete "arises" insert --arise--; and
    line 64, delete "It is an" insert --An-- and after "invention" insert --is--.

Col. 2, line 1, delete "It is another" insert --Another-- and after "invention" insert --is--;
    line 5, delete "It is a" insert --A-- and after "invention" insert --is--;

UNITED STATES PATENT AND TRADEMARK OFFICE
CERTIFICATE OF CORRECTION

PATENT NO. : 5,922,411
DATED : July 13, 1999             Page 2 of 6
INVENTOR(S) : SHIMIZU et al It is certified that error appears in the above-identified patent and that said Letters Patent is hereby corrected as shown below:

line 9, delete "It is a" insert --A-- and after "invention" insert --is--;

line 15, delete "It is a" insert --A-- and after "invention" insert --is--;

line 19, delete "It is a" insert --A-- and after "invention" insert --is--;

line 23, delete "It is a" insert --A-- and after "invention" insert --is--;

line 34, delete "not more";

line 35, delete "than";

line 47, delete "there is provided";

line 48, delete "which com-" and insert --is provided--;

line 49, delete "prises";

line 54, delete "there is pro-";

line 55, delete "vided" and delete "which" insert --is provided comprising--;

line 56, delete "comprises";

line 60, delete "there is";

line 61, delete "provided" and delete "which" insert --is provided comprising--;

UNITED STATES PATENT AND TRADEMARK OFFICE
CERTIFICATE OF CORRECTION

PATENT NO. : 5,922,411
DATED : July 13, 1999
INVENTOR(S) : SHIMIZU et al

Page 3 of 6

It is certified that error appears in the above-identified patent and that said Letters Patent is hereby corrected as shown below:

line 62, delete "comprises";

line 66, delete "there is"; and line 67, delete "provided" and delete "which" insert --is provided--.

Col. 3, line 1, delete "comprises" insert --comprising--;

line 6, delete "there is";

line 7, delete "provided";

line 8, after "processes" insert --is provided--;

line 9, delete "there is";

line 10, delete "provided";

line 11, delete "which comprises" insert --is provided comprising--;

line 12, delete "which comprises the steps of";

line 13, delete "forming, on the surface of the solid body";

line 17, delete "there is";

line 18, delete "provided";

line 19, delete "which comprises" insert --is provided comprising--;

line 25, delete "there is";

UNITED STATES PATENT AND TRADEMARK OFFICE
CERTIFICATE OF CORRECTION

PATENT NO. : 5,922,411
DATED : July 13, 1999
INVENTOR(S) : SHIMIZU et al

It is certified that error appears in the above-identified patent and that said Letters Patent is hereby corrected as shown below:

line 26, delete "provided";
      line 27, delete "which comprises" insert --is provided comprising--;
      line 34, delete "there is";
      line 35, delete "provided"; and
      line 37, after "processes," insert --is provided--.

Col. 4, line 62, "and R2" should read --and $R^2$--.

Col. 5, line 15, delete "other kinds of"; and
      line 53, delete "integer and M is a metal atom" insert --integers--.

Col. 6, line 12, delete "Besides" insert --In--.

Col. 7, line 39, delete "preferably" insert --preferable--;
      line 46, delete "aimed" insert --desired--.

Col. 10, line 34, delete "conventionally" insert --conventional--;
      line 35, delete "known";

UNITED STATES PATENT AND TRADEMARK OFFICE
CERTIFICATE OF CORRECTION

PATENT NO. : 5,922,411
DATED : July 13, 1999
INVENTOR(S) : SHIMIZU et al

It is certified that error appears in the above-identified patent and that said Letters Patent is hereby corrected as shown below:

line 44, delete "conventionally" insert --conventional--; and
      line 45, delete "known".

Col. 11, line 21, delete "For this reason, an appropriate" and insert --Appropriate--; and
      line 50, delete "a", both instances.

Col. 12, line 13, delete "a";
      line 14, delete "a", first instance;
      line 22, delete "maybe" insert --may be--; and
      line 56, delete "unto" insert --into--.

Col. 14, line 5, delete "afore mentioned" insert --aforementioned--;
      line 13, delete "as";
      line 14, delete "display panels are exemplified" and insert --are exemplified by display panels--;
      line 29, delete "not more than"; and
      line 54, delete "not more than".

UNITED STATES PATENT AND TRADEMARK OFFICE
CERTIFICATE OF CORRECTION

PATENT NO. : 5,922,411
DATED : July 13, 1999
INVENTOR(S) : SHIMIZU et al

Page 6 of 6

It is certified that error appears in the above-identified patent and that said Letters Patent is hereby corrected as shown below:

Col. 15, line 53, delete "involve" insert --involves--.

Col. 16, line 65, "($cm^{31\ 1}$)" should read --($cm^{-1}$)--.

Col. 45, line 9, before "steam" insert --with--.

Signed and Sealed this

Sixth Day of February, 2001

Attest:

Q. TODD DICKINSON

Attesting Officer

Director of Patents and Trademarks